United States Patent [19]

Tanny

[11] Patent Number: 4,776,508
[45] Date of Patent: * Oct. 11, 1988

[54] ELECTRONIC COMPONENT LEAD TINNING DEVICE

[75] Inventor: Michael W. Tanny, Westminster, Calif.

[73] Assignee: Unit Design Inc., Fullerton, Calif.

[*] Notice: The portion of the term of this patent subsequent to Jan. 20, 2004 has been disclaimed.

[21] Appl. No.: 5,228

[22] Filed: Jan. 20, 1987

Related U.S. Application Data

[63] Continuation-in-part of Ser. No. 750,333, Jun. 28, 1985, Pat. No. 4,637,541.

[51] Int. Cl.$^4$ .................... B23K 31/02; B23K 37/04
[52] U.S. Cl. ................................ 228/102; 228/180.1;
228/207; 228/259; 228/262; 228/7; 228/38;
228/43; 228/36; 118/423; 427/123; 427/313;
427/329
[58] Field of Search ................. 228/180.1, 36, 38–40,
228/43, 207, 223, 262, 102, 7, 259; 118/423;
427/123, 312, 313, 329

[56] References Cited

U.S. PATENT DOCUMENTS

| | | |
|---|---|---|
| 2,671,264 | 3/1954 | Pessel . |
| 2,740,193 | 4/1956 | Pessel . |
| 2,770,875 | 9/1956 | Zimmerman . |
| 2,865,093 | 5/1957 | Ingram . |
| 2,872,625 | 2/1959 | Liebscher . |
| 2,884,612 | 4/1959 | Bang . |
| 2,964,007 | 12/1960 | Buffington . |
| 3,037,274 | 6/1962 | Hancock . |
| 3,039,185 | 6/1962 | Oates . |
| 3,041,991 | 6/1962 | Dvorak . |
| 3,053,215 | 9/1962 | Guty . |
| 3,100,471 | 8/1963 | Gutbier . |
| 3,108,560 | 10/1963 | Bowne . |
| 3,112,723 | 12/1963 | Potocki . |
| 3,122,117 | 2/1964 | Marzullo et al. . |
| 3,135,630 | 6/1964 | Bielinski et al. . |
| 3,216,643 | 11/1965 | DeVerter . |
| 3,218,193 | 11/1965 | Isaacson . |
| 3,226,821 | 1/1966 | Van Dijk et al. .............. 228/31 |
| 3,303,983 | 2/1967 | Patrick . |
| 3,386,166 | 6/1968 | Tardoskegyi . |
| 3,439,854 | 4/1969 | Walker . |
| 3,482,755 | 12/1969 | Raciti . |

(List continued on next page.)

FOREIGN PATENT DOCUMENTS

| | | | |
|---|---|---|---|
| 146250 | 11/1979 | Japan | 228/36 |
| 151534 | 11/1979 | Japan | 228/36 |
| 40076 | 3/1980 | Japan | 228/36 |
| 40075 | 3/1980 | Japan | 228/36 |
| 88977 | 7/1980 | Japan | 228/36 |
| 76660 | 5/1984 | Japan | 228/38 |

Primary Examiner—Nicholas P. Godici
Assistant Examiner—Samuel M. Heinrich
Attorney, Agent, or Firm—Harness, Dickey & Pierce

[57] ABSTRACT

An electronic component tinning apparatus comprising a longitudinal base unit having two longitudinally extending sides connected to a first end and an opposing second end, a top portion connected to and bounded by said sides and ends with an open longitudinal central cavity, and two spaced-apart, parallel longitudinally extending rails mounted on the top portion on opposing sides of said central cavity; a flux tank mounted in said central cavity approximate said first end to hold a liquid flux for flux-coating electronic component leads; a heated pot mounted in said central cavity approximate said second end to hold a hot molten solder bath for tinning the electronic component leads; a powered, wheeled electronic-component transport adapted to ride on said rails to carry electronic components from said first end over the flux tank to the second end over said solder pot and back again; two powered cam means mounted in said transport, rotatable to a high transport position and a low processing position, said cam means adapted to carry and vertically move an electronic-component carrier to the high transport position and the low processing position; first sensing means to detect the position of said transport on said base unit; second sensing means to detect the position of each of said cam means; and control means connected to said first and second sensing means to receive signals therefrom and connected to said powered transport and said powered cam means to send control signals thereto.

35 Claims, 7 Drawing Sheets

U.S. PATENT DOCUMENTS

| | | |
|---|---|---|
| 3,532,262 | 10/1970 | Laubmeyer et al. . |
| 3,565,319 | 2/1971 | Eschenbrucher ............ 228/36 |
| 3,570,741 | 3/1971 | Corsaro et al. . |
| 3,588,998 | 6/1971 | Corsaro . |
| 3,604,611 | 9/1971 | Lamberty . |
| 3,680,762 | 8/1972 | Kondo ............ 228/36 |
| 3,721,379 | 3/1973 | Corsaro . |
| 3,828,419 | 8/1974 | Wanner ............ 228/36 |
| 4,009,816 | 3/1977 | Feuchtbaum et al. . |
| 4,090,654 | 5/1978 | Volkert . |
| 4,180,199 | 12/1979 | O'Rourke et al. . |
| 4,284,225 | 8/1981 | Hess . |
| 4,285,457 | 8/1981 | Kondo . |
| 4,311,265 | 1/1982 | Kondo . |
| 4,311,266 | 1/1982 | Kondo ............ 228/180.1 |
| 4,363,434 | 12/1982 | Flury . |
| 4,401,253 | 8/1983 | O'Rourke . |
| 4,402,448 | 9/1983 | O'Rourke . |
| 4,410,127 | 10/1983 | Bodewig . |
| 4,424,931 | 1/1984 | Lovrenich . |
| 4,469,716 | 9/1984 | Caratsch . |
| 4,512,508 | 4/1985 | Pachschwoll . |
| 4,512,510 | 4/1985 | Kondo ............ 228/180.1 |
| 4,530,457 | 7/1985 | Down . |
| 4,603,243 | 7/1986 | Septfons et al. ............ 219/85 BA |
| 4,637,541 | 1/1987 | Tanny ............ 228/180.1 |

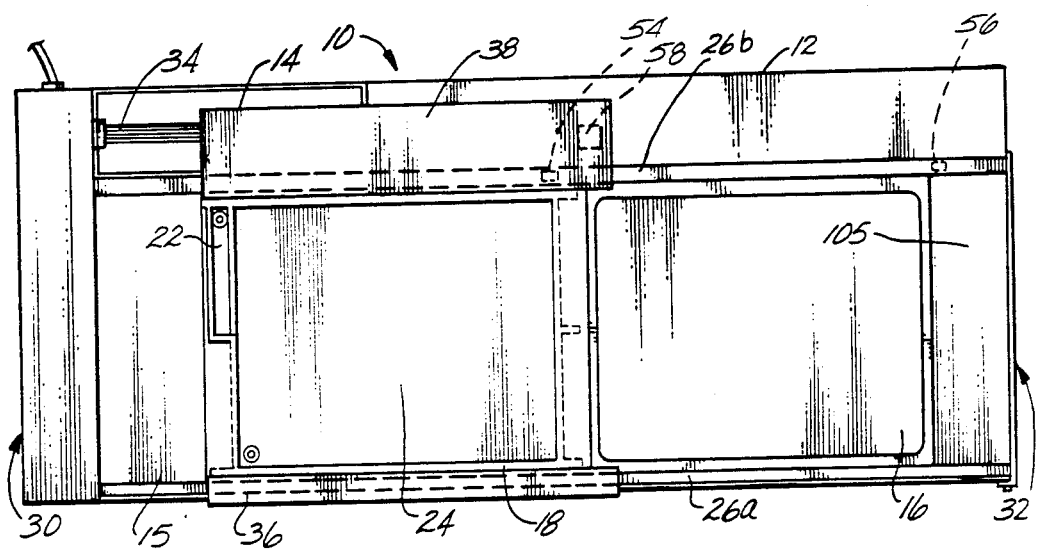
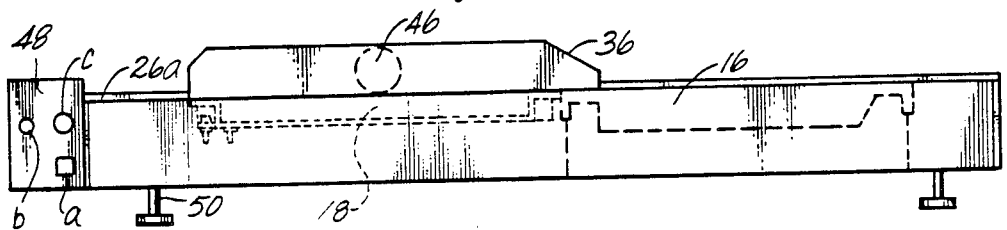

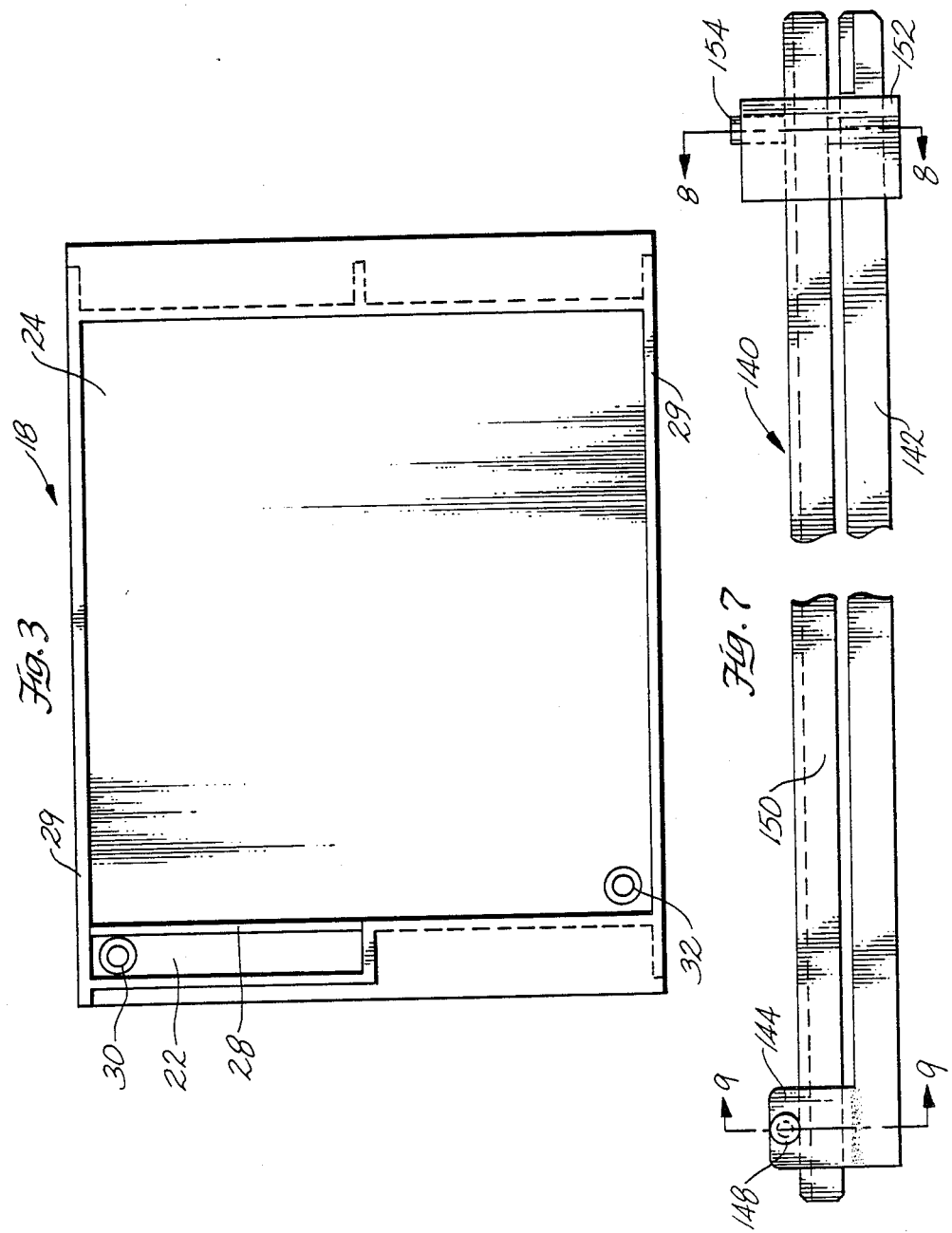

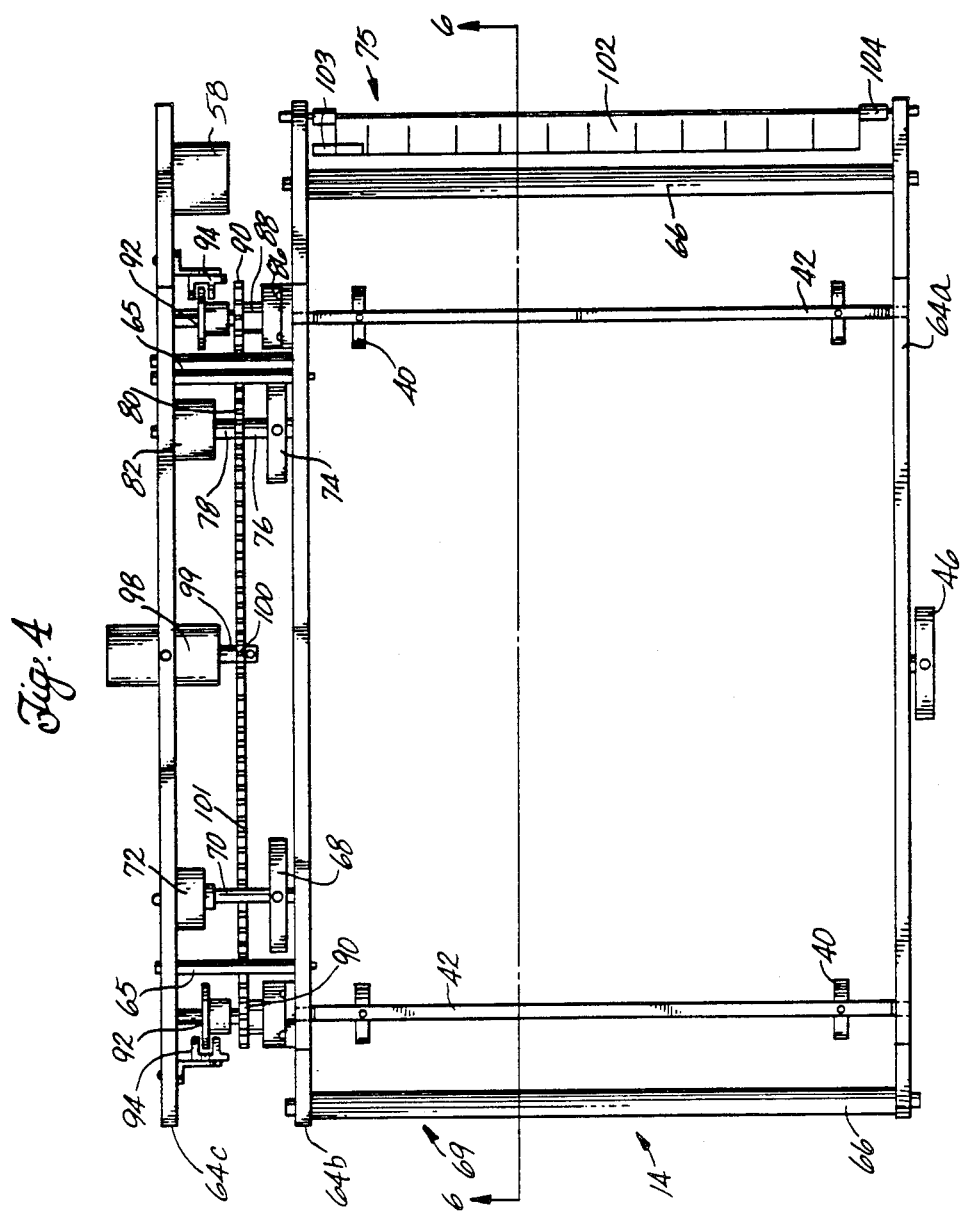

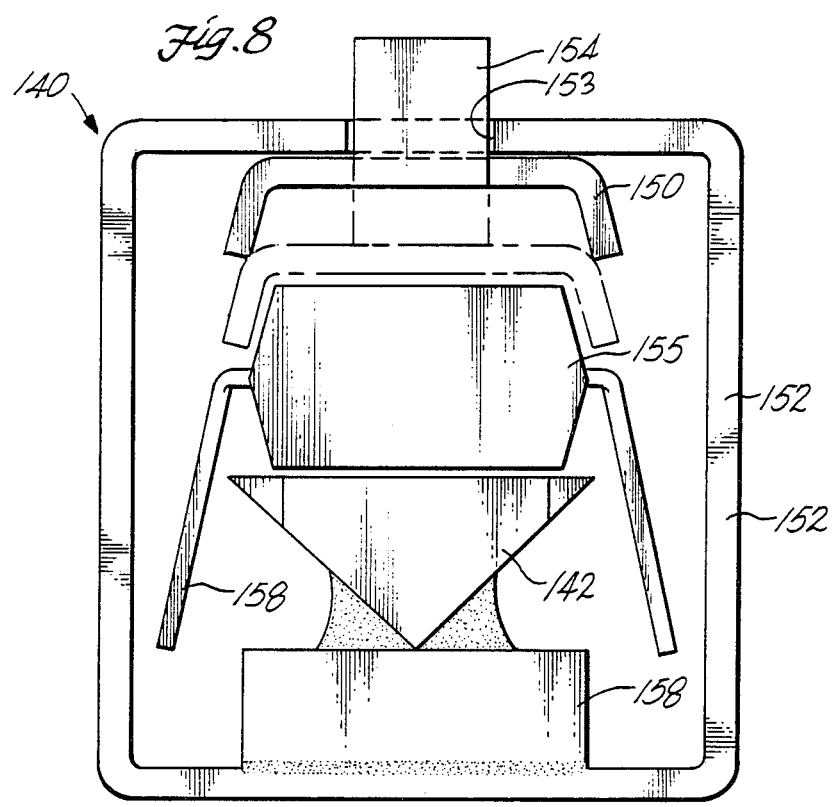
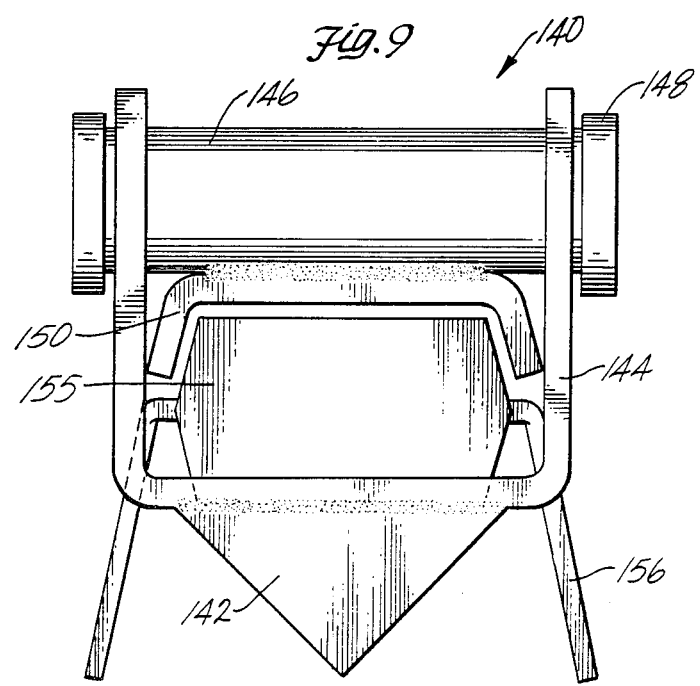

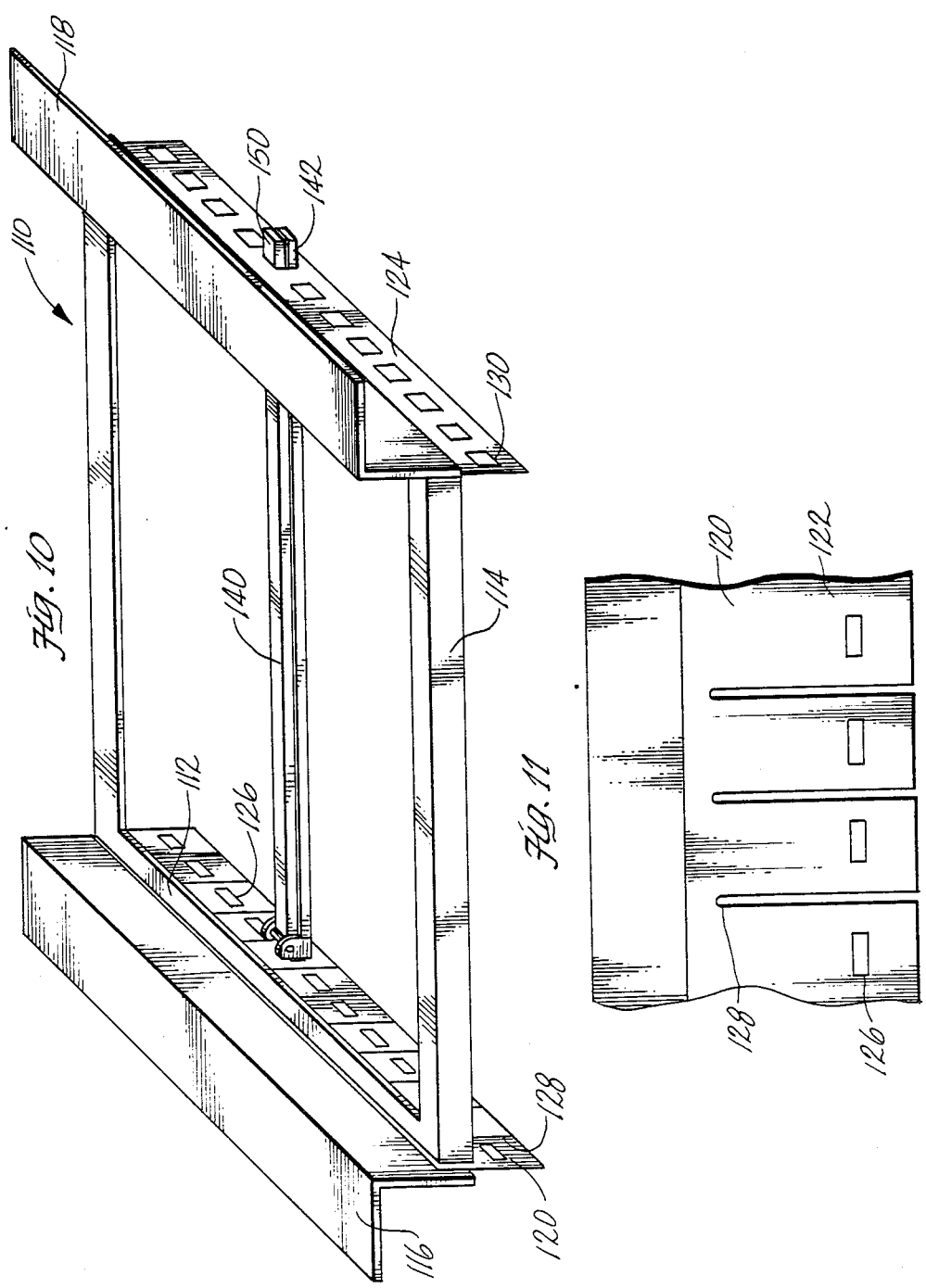

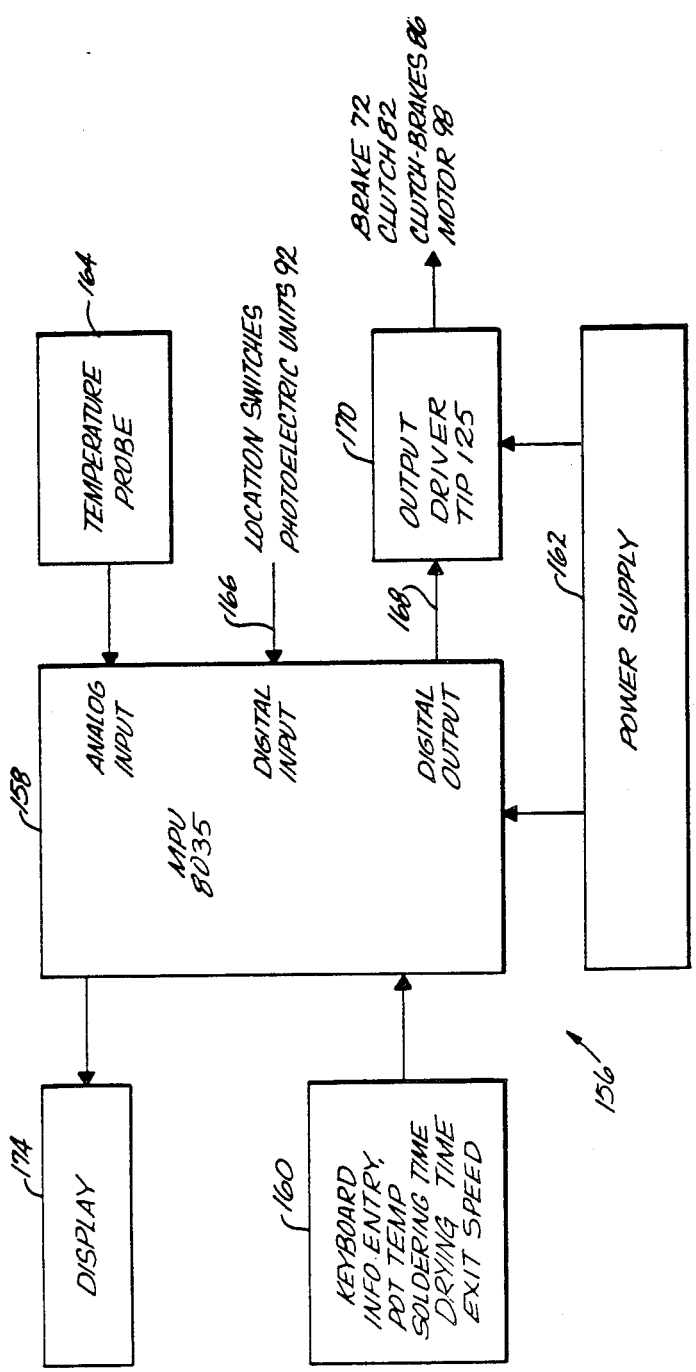

ELECTRONIC COMPONENT LEAD TINNING DEVICE

RELATED APPLICATIONS

This application is a continuation-in-part of U.S. Application Ser. No. 750,333 for a CIRCUIT BOARD SOLDERING DEVICE, filed June 28, 1985 now U.S. Pat. No. 4,637,541.

BACKGROUND OF THE INVENTION

The leads of electronic components are tinned prior to use and soldering. Integrated circuits are normally assembled with pretinned leads. The leads are tinned by applying a flux coating to the leads, drying the coating, applying molten solder to the flux-coated leads, and cleaning the coated tinned leads to remove excess flux.

Properly tinned leads are essential for the formation of a good solder joint between the lead and a connecting conductor. Tinned leads after a period of time, such as six months, develop an oxide coating and/or coating from other contaminants that interfere with the formation of a good solder joint. As a result, for high-quality electronic devices the leads of all electronic components utilized in the devices must be freshly tinned. This requirement has compelled the electronic industry to date-control their electronic component inventory and to junk, degrade or re-tin electronic components prior to assembly. The retinning operation has been primarily a hand operation because there are not many suitable or affordable tinning machines on the market.

The present invention is directed to a tinning apparatus that can be used to tin and re-tin a plurality of electronic components at one time, that is, tin and/or re-tin the leads of electronic components. The device of the present invention automatically fluxes, dries the flux coating and tins the leads of a plurality of electronic components at one time. In addition, if something goes wrong during the operation the operation can be promptly aborted. The process and device can be used for original tinning or retinning. For retinning, the tinned lead is fluxed (frequently with a flux compounded for retinning), the flux coating is dried and the fluxed lead is retinned with molten solder.

SUMMARY OF THE INVENTION

The present invention is directed to a tinning process for electronic components and an automatic tinning device for electronic components, such as an integrated circuit ("IC" herein), dual inline package integrated circuit ("DIP" herein), surface mounted device ("SMO" herein), resistor, capacitor, transistor, diode, and the like. Moreover, the present device provides a soldering machine which returns the tinned electronic components to the feed end so that an operator can operate the machine at a single position and is not required to go from one end of the machine to the other to feed and recover the electronic components. Furthermore, the present device permits retrieval of the electronic components at the feed end at any stage of the tinning operation. When the operation of the machine is aborted, the electronic component is transported back to the feed end without passing through any of the previous stages. In addition, the present invention provides a means of constructing a short machine requiring a relatively small amount of floor space. This has been accomplished by using the tinning station as both a flux-drying and tinning station.

The present invention is directed to a process for tinning the leads of electronic components comprising the steps of:
 (a) applying a flux coating to the leads of electronic components;
 (b) drying the flux coating on saifd leads by positioning the leads over a hot molten tinning bath;
 (c) tinning the leads by lowering and horizontally moving the leads into the hot molten tinning bath to immerse the leads in the tinning bath; and
 (d) lifting the tinned leads from the tinning bath.

The term "electronic component" means an element, part or member used in electronic, electrical and electromechanical devices and having one or more electrically conductive lead(s) adapted to be soldered to conductive connectors. By the term "tinning an electronic component" it is meant tinning the electrically conductive leads of the electronic component. By the term "leads" is meant electrically conductive leads. The term "flux" is meant to include liquid aqueous, nonaqueous and rosin soldering flux. The flux is applied to the leads by immersing the leads into liquid flux to insure that the leads are evenly, uniformly and thinly coated and that the coating is substantially free of holidays, i.e., holes in the coating. Thereafter, the flux-coated lead is poised over a hot tinning bath to substantially complete the drying of the flux coating and optionally preheat the leads. Typically, the temperature of the tinning bath will be between 450° F. and 500° F., preferably about 460° F. The electronic component is stationed over the tinning bath containing hot molten solder for about 1 second to about 99 seconds, preferably from about 10 seconds to about 20 seconds. The electronic component is stationed at a height of about ¼ inch to about 3 inches above the surface of the tinning bath, preferably about 2 inches above the surface of the tinning bath. A substantially dry flux coating is preferred for proper tinning. If a lead is immersed in the tinning bath with a moist flux coating, gas bubbles are rapidly formed which can cause splattering of the solder. The lead is immersed in the hot molten tinning bath for between about 0.1 second and about 10 seconds, preferably between about 3 seconds and about 4 seconds. The lead is then moved in an arc upwardly, that is, horizontally in one direction as well as vertically upward, to minimize icicling at the lead tips. Optionally, the leads may be oscillated traversely in the hot molten solder to further the sweeping of air and gas bubbles. The tinned lead is then lifted from the solder and allowed to cool. The flux-tinned leads are optionally cleaned and/or washed to remove residual flux from the leads.

In an alternative embodiment of the present invention, after the lead is immersed in the hot molten solder, the board is moved or oscillated backward and forward one or more times.

The present invention is also directed to an electronic-component tinning device for carrying out the above-identified process. The tinning device comprises the following elements:
 (a) a longitudinal base unit having two longitudinally extending sides connected to a first end and an opposing second end, a top portion connected to and bounded by said sides and ends with an open longitudinal central cavity, and two spaced-apart, parallel longitudinally extending rails mounted on the top portion on opposing sides of said central cavity;

(b) a flux tank mounted in said central cavity approximate said first end to hold a liquid flux for flux-coating electronic component leads;

(c) a heated pot mounted in said central cavity approximate said second end to hold a hot molten solder bath for tinning the electronic component leads;

(d) a powered, wheeled electronic-component transport adapted to ride on said rails to carry electronic components from said first end across the flux tank to the second end over said solder pot and back again;

(e) two powered cams mounted in said transport, rotatable to a high transport position and a low tinning position, said cams adapted to carry and vertically move an electronic-component carrier to the high transport position and the low tinning position;

(f) first sensing means to detect the position of said transport on said base unit;

(g) second sensing means to detect the position of each of said cams; and (h) control means connected to said first and second sensing means to receive signals therefrom and connected to said powered transport and said powered cams to send control signals thereto.

In one embodiment of the present invention, the above tinning apparatus carries out the tinning operation of an electronic component in three stages or steps. At the commencement of the operation, the cams are positioned in a transport position and one or more electronic components are mounted in the electronic-component carrier supported by the transport. The transport is loaded with an electronic component carrier when the transport is positioned over the flux tank. In the first step, with the transport at a position over the flux tank, a flux coating is applied to the leads of the electronic component by rotating the cams to a tinning position to lower the leads into the liquid flux. The cams then rotate to the transport position to lift the leads from the flux. In a second step, the transport is moved to a position over the heated pot wherein the heat from the hot molten solder dries the flux coating. In a third step, the leads with the dried coating are tinned by rotating the cams to a tinning position to immerse the leads in the hot molten solder. The cams are rotated to the transport position after a predetermined time to lift the leads from the molten solder. The transport then moves back towards the first end to a start position over the flux tank.

In the preferred embodiment of the invention, the transport has a skimmer blade which skims off the metal oxide and scum layer from the surface of the hot molten solder when the transport moves over the heated pot. Preferably, after the drying or second step, the transport moves away from, then back over, the pot before the tinning or third step, to have the skimmer blade expose a fresh solder surface to the leads.

In an alternative embodiment of the present invention, the cams are partially rotated clockwise and counterclockwise to move the leads longitudinally back and forth in the hot molten solder after the leads have been immersed in the solder.

The above functions of the transport and the cams can easily be controlled by hard switches, conventional computers and microprocessors, and other conventional devices known to the art. The position of the cams is sensed by the second sensing means, and the position of the transport on the base unit is detected by the first sensing means, which is signaled to the control circuit.

When the cams are in a high transport position, the leads mounted on the electronic-component carrier will clear the tinning pot and the flux tank. When the cams are in a low tinning position, the leads are immersed in the liquid flux or molten solder.

In the preferred embodiment of the present invention, the device includes an abort circuit which will transmit an abort signal when actuated to the control circuit, which will override all other signals received by and transmitted to the control circuit. The control circuit, upon receipt of the abort signal, will command the cams to rotate to the transport position, thus lifting the leads above the tinning pot and the flux tank, and will command the transport to move toward the front end of the device to the start position.

The present invention is also directed to a powered, wheeled transport for carrying an electronic component or a circuit board on a tinning or soldering machine having flux, drying and soldering stations. The transport comprises:

(a) a chassis supported by a plurality of rotatable wheels for movement back and forth along a horizontal track;

(b) a means for powering at least one of said wheels to move said chassis back and forth along said track;

(c) first and second parallel rotatable cams rotatably supported by said chassis and adapted to support and move an electronic component carrier to flux, dry and solder the electronic component leads at fluxing, drying and soldering stations; and (d) a means for rotating said first and second cams to move the electronic component carrier.

The transport can be used on the present tinning device and on the circuit board soldering device of my U.S. Pat. No. 4,637,541, that will issue on Jan. 20, 1987 (U.S. application Ser. No. 750,333 filed June 28, 1985), the disclosure of which is hereby incorporated by reference. The cams can move a carrier vertically to one or more positions, such as two positions for the tinning device or three positions for the circuit board soldering device of U.S. Pat. No. 4,637,541. The cams can support a variety of carriers having cam receiver means for movement. The carriers can hold circuit boards or electronic components. The transport has at least one powered wheel to move the transport from different stations, such as feed, fluxing, drying and soldering stations, and back again.

The present invention is also directed to an integrated circuit support fixture that can receive DIPs from a DIP stick. After the tinning operation, the DIPs can be slid back into the DIP stick. The integrated circuit support fixture comprises:

(a) rail means having first and second ends adapted to receive and support a plurality of integrated circuits on their bases;

(b) a hinge means attached to the first end of said rail means;

(c) a bail means attached to the second end of said rail means; and (d) a channel member having a planar backbone, two sidewalls extending therefrom, and first and second opposing ends, said member spaced apart from said rail means in a parallel relationship with said sidewalls extending toward said rail means to encircle the top portion of the integrated circuit, the first end of said channel member attached to said hinge means to permit said member to move in a hinged relationship with respect to said rail means, the second end of said member engaging said bail means to limit the hinge movement of said member with respect to said rail means.

BRIEF DESCRIPTION OF THE DRAWINGS

FIG. 1 is a top plane view of the electronic-component tinning apparatus of the present invention;

FIG. 2 is a side elevational view of the front side of the electronic-component tinning apparatus of the present invention;

FIG. 3 is a top plane view of the flux tank of the electronic-component tinning apparatus of the present invention;

FIG. 4 is a top plane view of a circuit board transport of the electronic-component tinning apparatus of the present invention;

FIG. 7 is a side elevational view of the integrated circuit support fixture of the present invention;

FIG. 8 is a vertical sectional view of the support fixture of FIG. 7 along lines 8—8;

FIG. 9 is a vertical sectional view of the support fixture of FIG. 7 along lines 9—9;

FIG. 10 is a perspective view of the electronic-component carrier of the present invention;

FIG. 11 is a fragmentary vertical sectional view of the electronic-component carrier of FIG. 10 within circle line 11; and FIG. 12 is a block diagram of the control circuit for the electronic-component tinning apparatus of the present invention.

DETAILED DESCRIPTION OF THE INVENTION

Figure 5:
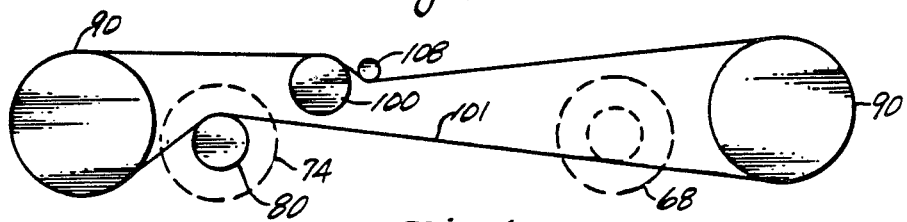
FIG. 5 is a schematic view of the drive train of the transport of FIG. 4.

Referring to FIG. 1, the electronic-component tinning apparatus 10 of the present invention is shown in the top plane view. The apparatus comprises a base or console 12 and a powered, wheeled transport 14 that is adapted to move longitudinally along the length of the console by friction drive. The console has a central cavity 15 running substantially the full length of the console. A heated tinning or solder pot 16 traversing the width of the central cavity is located at the production end (or rear end or second end) of the cavity for holding a hot molten solder bath. A flux tank 18 for holding a liquid flux bath 18 is positioned within the central cavity adjacent the solder pot. Two parallel rails 26a and 26b are mounted on top of the console on opposite sides of the central cavity and run the full length of the console. The rails have a smooth upper surface with a brushed, satin or polished finish. The solder pot is located at the production or rear end 32 of the console. Boards are fed into and retrieved from the feed or front end 30 of the console.

The solder pot 16 is of conventional design and is equipped with a heating element (not shown) to heat the pot and the solder bath contained therein and a thermocouple (not shown) to monitor the temperature of the solder bath. Preferably, the temperature of the solder bath is monitored and controlled by the control circuit also.

A ribbon cable 34 runs approximate the feed end of the console into the transport. The ribbon cable feeds power and control signals to the transport from a control circuit described herein which can be mounted in, on or outside the console. Location or position signals from the transport are also transmitted via the ribbon cable to the control circuit. The ribbon cable is secured to the console and the transport such that the cable forms a U shape when viewed from the side, with a leg of ribbon attached to the console and another leg attached to the transport. As the transport moves longitudinally from the feed end to the production end, the U-formed ribbon cable unwinds, lengthening the leg attached to the console and shortening the leg attached to the transport. When the transport moves longitudinally from the production end to the feed end, the U-formed cable ribbon winds back to its original U-shaped configuration, with the leg attached to the console shortening and the leg attached to the transport lengthening within a cover 38 of the transport. The console is mounted on four adjustable support legs 50. The legs are adjustable to properly level the console and the surfaces of the liquid flux and molten solder baths in the solder pot.

The transport 14 has a right-hand cover 36 and a left-hand cover 38, which are removable. The right side of the transport is supported by a single wheel 46 that is adapted to roll along the right-hand rail 26a. At the feed end of the console, there is located a control panel 48 having an on-off power switch a, a tinning operation cycle start button b, and an emergency reset or abort button c. Two sensors 54 and 56 mounted in the console underneath the left-hand rail are used to detect the position of the transport. Sensor 54 detects the transport when it is positioned over the flux tank, and sensor 56 detects it over the heated pot. The sensors are reed switches that are actuated by a permanent magnet 58 carried by longitudinal frame 64c of the transport (FIG. 4).

Referring to FIG. 3, the flux tank 18 comprises a small flux overflow reservoir 22 and a large flux reservoir 24 for holding a liquid aqueous or nonaqueous flux bath for flux-coating the electronic component leads. The large reservoir is separated from the overflow reservoir by an overflow weir 28, which has a smaller height than the walls 29 of the tank. The overflow reservoir 22 has an outlet 30 and the large reservoir has an inlet 32. The outlet is connected by piping or tubing to a liquid flux storage tank (not shown). A motorized pump (not shown) pumps liquid flux from the storage tank via tubing or piping (not shown) to the inlet 32. During operation of the apparatus of the present invention, the pump continually pumps liquid flux from the storage tank into the large reservoir to maintain a continuous circulation of liquid flux. The excess flux flows out of the large reservoir over the overflow weir into the overflow reservoir wherein the liquid flux flows into the storage tank out of outlet 30 by gravity feed. The liquid flux will contain volatile components that will evaporate from the surface of the flux in the large reservoir. Accordingly, to maintain a relatively constant flux composition, the composition is continually circulated from the storage tank, which will have a capacity of at least two times that of the large reservoir. The pump can be energized via the on-off power switch or the control circuit.

The details of transport 14 are further shown in FIG. 4. The transport has two lateral cam shafts 42. Each cam shaft has two spaced-apart cylindrical carrier cams 40 eccentrically mounted on the shafts. The transport has three spaced-apart parallel longitudinal frames 64a, 64b and 64c. The frames are transversely connected by lateral struts 66. A single wheel 46 is mounted centrally on the right-hand longitudinal frame 64a and is adapted to rotate freely. A second wheel 68 is mounted on the left-hand side and is adapted to rotate freely except when braked. When electro-brake 72 is energized, wheel 68 is free to rotate, and when brake 72 is not energized, wheel 68 is braked. Wheel 68 is attached to shaft 70, which is support for rotation by the near left-hand side of frame 64b and electro-brake 72 mounted on the far left-hand side of frame 64c. A third wheel 74 is also mounted on the left-hand side of the transport. Wheel 74 is attached to shaft 76, which is supported for rotation by frame 64b and electro clutch 82 mounted on frame 64c. A sleeve 78 extends from the clutch 82 concentrically with shaft 76 and has a sprocket 80 mounted thereon. When electroclutch 82 is energized or actuated, sprocket 80 is coupled to shaft 76 via sleeve 78 and clutch 82. When clutch 82 is not actuated, sprocket 80 is decoupled from shaft 76 and wheel 74 is free to rotate. Wheels 68 and 74 ride on the left-hand rail 26b. Both cam shafts 42 are supported for rotation at one end by frame 64a and at approximately the other end by frames 64b and 64c. On the left-hand side, the shafts are mounted concentrically with electro clutch-brakes 86 and sleeves 88 extending outwardly from clutch-brakes 86. A sprocket 90 is mounted on each sleeve 88. The construction of both cam shafts, their supporting structure, and their drive structure are substantially similar. Each cam shaft has a positioning disk 92 mounted concentrically thereon. The disks rotate through a photoelectric unit 94 having a photo element and a detection element (not shown). The photoelectric units are mounted on frame 64c. The disks have opaque and clear areas. The clear areas and photoelectric units are positioned relative to cams 40 so that the photoelectric units can detect when the cams 40 are facing vertically downward and vertically upward. When the electro-brake clutch 86 is actuated or energized, the brake action on the cam shaft 42 is released and sprocket 90 is coupled to the cam shaft via the brake clutch. When the brake clutch is not actuated or energized, the clutch action is released, decoupling the sprocket 90 from the cam shaft and the cam shaft is braked to a stop.

Motor 98 is mounted on frame 64c for powering the cam shafts 42 and the drive wheel 74. A sprocket 100 is mounted on a drive shaft 99 of the motor. The sprockets 80, 90 and 100 are positioned in line, in a single plane, so that they all are connected and driven by a single chain belt 101, which is powered by motor 98 via sprocket 100.

At the production end 75 of the transport, a skimmer blade 102 is transversely mounted between longitudinal frames 64a and 64b and is adapted for rotation about fingers 104, which are rotatably carried by the two longitudinal frames. On the left-hand side of the blade, a guide pin 103 extends outwardly to the side which is adapted to slide along the left-hand side of the solder pot 16 when the transport is moving across the pot.

The skimmer blade normally hangs vertically downward, except when it is traveling over or positioned over the flux tank or solder pot 16. When the transport is passing over or is positioned above the flux tank, the guide pin 103 in conjunction with a wall of the flux tank positions the skimmer blade in a horizontal position above the surface of the liquid flux. When the transport is passing over the pot from the feed end to the production end, the blade is supported in a horizontal position by the hot molten solder on the pot and by guide pin 103. When the transport moves across the solder pot 16 from the feed end to the production end, the skimmer blade skims off the metal oxide skin on the surface of the hot molten solder and deposits it in oxide reclaim chamber 105 at the production end of the console (FIG. 1). When the transport is positioned over the pot for the drying and tinning steps, the skimmer blade is positioned over the reclaim chamber. When the transport moves across the solder pot 16 from the production end to the feed end, the skimmer blade is reversed and guide pin 103 slides along the left-hand side of the solder pot, lifting the skimmer blade above the surface of the hot molten solder in the pot. The metal oxide skin interferes with soldering. Accordingly, removal of the metal oxide skin just prior to the tinning step is preferred.

The drive path of the chain belt 101 is graphically illustrated in FIG. 5. Motor 98 drives the chain belt via sprocket 100. The chain belt in turn drives sprocket 80 of the drive wheel 74 and sprockets 90 of the two cam shafts 42. Drive wheel 74 is powered when electro clutch 82 is actuated, the power being transmitted from the motor through the chain belt, sprocket 80, sleeve 78, clutch 82, and shaft 76. Wheel 68 is unpowered but has an electro brake 72 wired in parallel with electro clutch 82. They are energized together to release wheel 68 and power wheel 74 as described above. The cam shafts 42 are operated independently and rotated when electro clutch brakes 86 are electrically actuated. Units 86 function as brakes when they are not electrically actuated. When units 86 are actuated, shafts 42 are rotated by motor 98 via the chain belt 101, sprockets 90, sleeves 88, and electro clutch-brakes 86. Tension is maintained on chain belt 101 by idler pulley 108, which is schematically shown in FIG. 5.

As described above, the electro clutch-brakes 82 and 86 function as brakes, except when electrically actuated, and prevent the rotation of wheels 68 and 74 or cam shafts 42. The electro brake 72 functions as a brake also, except when electrically actuated.

Figure 6:
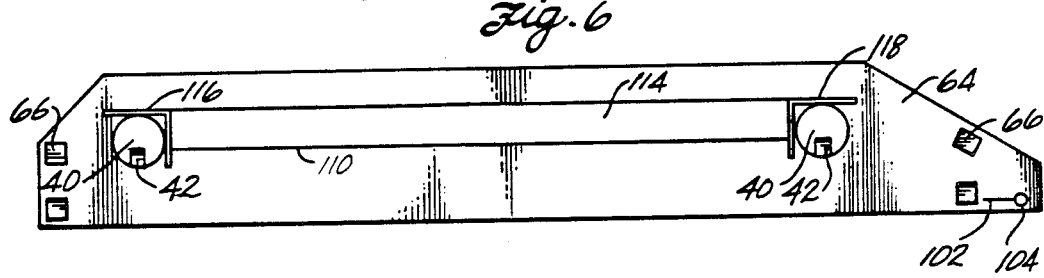
FIG. 6 is a vertical sectional view on lines 6—6 of FIG. 4 of the transport.
Figure 6A:
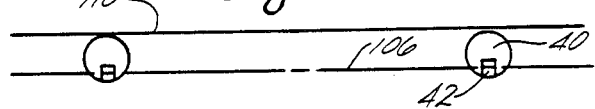
FIG. 6A is a schematic view of the cams and electronic-component carrier of FIG. 6 in a high transport position.
Figure 6B:
FIG. 6B is a schematic view of the cams and carrier of FIG. 6 in an interim rotation position.
Figure 6C:
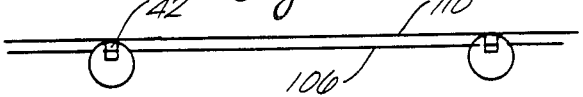
FIG. 6C is a schematic view of the cams and carrier of FIG. 6 in a low tinning position.

The operation and function of the cams 40 is illustrated in FIGS. 6A through 6C. The cam shafts 42 and cams 40 support a removable rectangular electronic-component carrier 110 (See also FIGS. 6 and 10) having longitudinal side members 114 connected at each end to lateral end members 112. Cam followers 116 and 118 (L-shaped brackets) are mounted on the end members 112. The cam followers are adapted to ride on cams 40. The cams and the cam shafts rotate in a clockwise direction. The cams are adapted to support the carrier 112 in one of two positions. Movement of the cams is coordinated with the operation of the transport during the tinning operation by the control circuit. In operation, electronic components are removably mounted in the carrier 110. When the tinning operation is commenced by punching start button b on control panel 48, the cams are in the high transport position (FIG. 6A).

Information signals from sensors 54 and 56 regarding the position of the transport are received by the control circuit described below which actuates the cams as described herein. At the beginning of the first step of the cycle, the cams are in the high transport position shown in FIG. 6A. In this position, the electronic component leads clear the flux tank and the heated pot when the transport is moved.

The tinning operation is commenced by pushing start button b on control panel 48, which activates the control circuit. The transport is positioned over the flux tank. The control circuit commands the cams rotate to a low tinning position, lowering the electronic-component carrier for flux-coating the leads of the electronic components in the liquid flux bath. The control circuit then commands the cams to rotate to a high transport position, lifting the leads from the flux bath. In the next step of the operation, the control circuit commands the transport to move to the position over the heated pot. The transport remains over the heated pot for a predetermined time to substantially dry the flux coating on the leads. Then, the transport backs off the heated pot and returns in order that the skimmer may skim off the dross from the surface of the solder. The control circuit then commands the cams to rotate to a tinning position to lower the flux-coated leads into the hot molten solder. After a predetermined length of time, the control circuit commands the cams to rotate to a high transport position at a predetermined speed, lifting the leads from the hot molten solder. Finally, the control circuit commands the transport to move back towards the feed end to a position over the flux tank wherein an operator can remove the carrier holding the tinned electronic components and feed a new carrier having electronic components that are to be tinned.

As can be seen, the transport for the electronic-component tinning apparatus only requires that the cams rotate to two positions. The transport that is mounted on the circuit board soldering device of U.S. Pat. No. 4,637,541 (Ser. No. 750,333 filed June 28, 1985) has cams that move to three positions to move the board to three different positions and/or two different attitudes for fluxing, drying, preheating and soldering circuit boards. The same transport, that is, transport 110, can be utilized for both the tinning apparatus and the circuit board soldering apparatus by programming the programmable microprocessor chip of the control circuit. FIG. 6A schematically illustrates the cams and the carrier in a high transport position. FIG. 6B illustrates the rotational interim position of the cams as the carrier and cams are rotated to a low tinning position, schematically illustrated in FIG. 6C. Line 106 represents the common plane of rotation of cam shafts 42 and is included for reference purposes.

The control circuit is programmed to rotate the cams in a clockwise direction to the low tinning position at the commencement of the operation cycle, causing the electronic component leads to be immersed in the flux bath in the large reservoir 24. After the immersion, the control circuit actuates the cams to rotate to a high transport position.

Actuation of the cams is carried out as follows: The control circuit actuates motor 98 and electro clutch-brakes 86 to power cam shafts 42. The cams are rotated in a clockwise direction and the rotational position of the cam shafts is detected by photoelectric unit 94, which transmits a rotational position signal to the control circuit. When the cam shaft has rotated the cams to the desired position, sensed by the photoelectric unit, the control circuit deactuates motor 98 and electro clutch-brakes 86 decoupling sprocket 90 from the cam shafts and actuating the brakes of the electro clutch-brake to promptly brake further rotation of the cam shafts. After the leads have been flux-coated for a predetermined time, the control circuit actuates the motor 98, and electro brake clutch 86 to rotate the cams to a high transport position which is sensed by the photoelectric unit. The unit transmits a rotation position signal to the control circuit which deactuates the motor 98 and brake clutch 86 when the high transport position has been achieved. The control circuit then actuates the motor 98, in a forward direction, clutch 82 to power drivewheel 74 and releases brake 72 to release wheel 68. The transport moves toward the production end to position over the heated pot. Sensor 56 senses the position of the transport over the heated pot and transmits a position signal to the control circuit. When the transport is over the heated pot, the control circuit deactuates motor 98, clutch 82 to decouple sprocket 80 from power drivewheel 74, and brake 72 to brake wheel 68 to a stop. The heat from the hot molten solder in the heated pot dries the flux coating on the leads. The drying time can vary depending upon the type of flux, the number of leads being tinned, and the like. The flux coating is not normally dired to a 100% moisture free condition. It is dried to a state where it will not cause splattering when immersed in the hot molten solder. This is a program variable that can be programmed into the control circuit, as described below. After a predetermined period of time which is sufficient to dry the flux coating, the control circuit actuates motor 98, in a reverse direction, clutch 82 to power drive wheel 74, and brake 72 to release wheel 68 to move the transport back off the pot toward the feed end until the position of the transport, then over the flux tank, is sensed by sensor 54. A transport position signal is sent by the sensor to the control circuit which deactuates the motor, clutch 82 and brake 72 to bring the transport to a stop. The control circuit then actuates the motor in a forward direction, the clutch 82 and brake 72 to move the transport back to a position over the pot while the skimmer blade skims the dross off the surface of the molten solder to expose a fresh surface for tinning. The sensor 56 senses when the transport is positioned over the pot and transmits a signal to the control circuit. The control circuit brakes the transport to a stop deactivating the motor 98, clutch 82 and brake 72 as described above. The control circuit then actuates the motor in a forward direction, electro clutch-brakes 86 causing the rotation of cam shafts 42 to rotate cams 40 to a low tinning position to immerse the leads in the hot molten solder bath. The photoelectric units 94 detect when the cams are in a low tinning position and transmit a rotation position signal to the control circuit, which in turn deactivates motor 98 and electro clutch-brakes 86, decoupling sprockets 90 from cam shafts 42 and brakes the cam shafts to a stop. After a predetermined period of time, which is a program variable that can be programmed into the control circuit, the control circuit actuates motor 98 in a forward direction and electro clutch-brakes 86 to rotate the cam shaft and the cams to a high transport position to lift the tinned leads out of the hot molten solder. Photoelectric unit 94 detects the rotation position of the cam shafts and when the cam shafts reach the high transport position a signal is transmitted to the control circuit which deactivates motor 98 and electro clutch-brakes 86 causing the decoupling of sprocket 90 from cam shaft 42 and the braking of the cam shafts to a stop. The control circuit then commands the transport to move back to the feed end by actuating motor 98 in a reverse direction, clutch 82 to power drivewheel 74 and brakes 72 to release wheel 68. When the transport moves to a position over the flux tank, sensor 54 detects its position and transmits a position signal to the control circuit. The control circuit then deactuates motor 98, electro clutch 82 and brake 72 to brake the transport to a stop.

The motor 98 gets pulsed by the control circuit to rotate the cam shafts 42 at a predetermined speed, which is a user-definable process variable that is programmed into the control circuit. Thus, the electronic-component carrier is raised and the leads are lifted from the hot molten solder at a predetermined speed to minimize solder bridging, which can be a problem when the leads are in close proximity to each other, and icicling on the leads. The predetermined amounts of time for the various operations, such as the period of time the flux-coated leads are allowed to dry over the heated pot, the period of time the leads are left in the liquid flux bath, and the period of time the leads are immersed in the hot molten solder, is a user-definable process variable that the operator can program into the control circuit. Before the leads are lifted out of the liquid flux bath or the hot molten solder, the control circuit can optionally command the cams to rotate back and forth, such as a total arc of 30°, to oscillate the leads in the flux or solder baths. Such a command is a user-definable process variable that the operator can program into the control circuit.

When the carrier containing the tinned electronic components arrives back at the feed end, the operator of the tinning device can remove the carrier from the transport and replace it with another carrier supporting electronic components to be tinned. The freshly tinned electronic components are cleaned to remove excess flux and the like. Frequently, the cleaning can be done with the electronic components remaining mounted on the carrier. When the other carrier is loaded on the transport, the operation of the tinning device can be started again by pushing the start button b of control panel 48. The entire operation of the device can be controlled at the feed end of the device where the carriers are fed onto and unloaded from the transport and where the control panel is located.

The carrier 110 is shown in FIG. 10 and comprises end frames 112 connected to parallel side frames 114 at right angles. The end frames and side frames are made from L-shaped members. Mounted at the first end of the carrier is a receiver plate 120 having a plurality of flexible fingers 122 to receive an integrated circuit support fixture 140, described below. A second receiver plate 124 without flexible fingers is mounted on the second end of the carrier. The two plates are parallel and have an equal number of apertures. The apertures are in line, that is, an imaginary line extending from the center of the aperture of one plate at a perpendicular will intersect the center of an opposing aperture in the other plate at a perpendicular. The fingers 122 have a single rectangular aperture 126 and each finger is separated from the adjoining fingers by slots 128. Cam followers 116 and 118 are mounted at the opposing ends of the carrier. The cam followers are adapted to be supported by, ride on, and be moved by cams 40. Other carriers can be used on the device as long as they have cam followers adapted to ride on and be moved by the cams 40.

The integrated circuit support fixture 140 is illustrated in FIGS. 7-9. The support fixture has a support frame 142, which has a triangular cross-section. The triangular frame is oriented such that the broadest side of the frame is oriented to form the top portion of the frame. A hinge yoke 144 is attached to the first end of the frame. The hinge yoke is apertured to rotatably receive a hinge pin 146, which is kept captive on the yoke by collars 148. One end of a channel member is attached to the hinge pin so that the channel member has a hinged relationship with respect to the frame. A bail means 152, which has a rectangular cross-section, is attached to the frame approximate the second end of the frame. The bail means receives the channel member and limits the hinge movement of such member. The top portion of the bail means has an aperture 153, which is adapted to receive an alignment pin 154 for slidable engagement; the pin is attached to the top portion of the channel member. This arrangement maintains the proper alignment between the channel member and the frame. A small spacing block 158 is attached to the inside lower portion of the bail means and the frame is secured to the block, such as by welding. The integrated circuit support fixture is adapted tor eceive DIPs from DIP sticks by aligning the second end of the frame with the DIP stick opening and lifting up the second end of the channel member as permitted by the bail means, permitting the DIPs to slide out of the DIP stick onto the top portion of the frame. The DIPs will slide down the frame. After the integrated circuit support fixture has been filled to capacity, that is, when the line of integrated circuits 155 has reached the bail, the channel member is released so that it falls toward the frame to constrain the integrated circuits onto the support fixture. The channel member and the frame embrace the integrated circuits, and prevent them from falling off the support fixture. The electrically-conductive leads 158 of the integrated circuit are not encumbered by the support fixture and are exposed to the liquid flux and the hot molten solder during the tinning operation when the support fixture mounted on a carrier is lowered into the liquid flux and hot molten solder to a depth which does not reach the top portion of the frame.

The support fixture 140 is mounted into carrier 110 by inserting the second ends of the frame and channel member into aperture 130 of the second receiver plate of carrier 110. The finger 122 having the opposing aperture 126 is flexed back to permit the support fixture to be swung into the carrier and the first end of the channel member to be inserted into the aperture 126. The finger is released and returns to its vertical planar configuration, thus securing the support fixture in the carrier. The bail means and the hinge yoke limit vertical movement of the support fixture when mounted in carrier 110. The bail means cannot pass through aperture 130 in the second receiver plate, and the hinge yoke cannot pass through aperture 126 of the first receiver plate. At the completion of the tinning operation, the reverse procedure is followed to remove the support fixture from the carrier. That is, the finger is flexed back to release the channel member from aperture 126, the support fixture is swung down to clear the fingers and the support fixture is pulled from the aperture 130. The tinned DIPs are easily returned to the DIP stick by aligning the frame and the opened end of the DIP stick, then raising the channel member to the height permitted by the bail means, and permitting the DIPs to slide down the frame toward the second end into the DIP stick.

If, during the operation of the electronic component tinning device, something goes awry, such as, a carrier becoming dislodged on the transport or an integrated circuit support fixture springing loose from the carrier or an electronic component falling from the carrier, the operation of the device may be aborted by pressing abort button c on control panel 48, which sends an abort signal to the control circuit, which in turn actuates the various electrical devices on the transport to rotate the cams to a high transport position and to move the transport back towards the feed end over the flux tank, regardless of the activity of the transport at the moment the abort button is pushed. The control circuit, during the abort operation, will actuate the motor 98 in the reverse direction, electro brake 72 to free wheel 68, electro clutch 82 to drive drivewheel 74 to move the transport toward the feed end of the device if the transport is not already positioned over the flux tank, and actuate electro clutch-brakes 86 if the cams are not in the high transport position to rotate the cams to the high transport position and then deactuate the electro clutch-brake 86 to brake the cam shafts 42 in the high transport position. When the sensor detects the position of the transport over the flux tank, the control circuit deactuates clutch 82 decoupling drivewheel 74 from sprocket 80, deactuates brake 72 to brake wheel 68 and deactuates motor 98.

The control circuit is shown in FIG. 12. The heart of the control circuit is a microprocessing chip 158. An MPU 8035 microprocessing chip may be employed in the operation of the present invention. The 8035 chip is manufactured by a number of firms, including Texas Instruments and National Semiconductor Corporation. The chip is programmed with a master resident program with a conventional microprocessor chip programmer. The computer program listing of the master resident program programmed into the 8035 chip (supplier: Texas Instruments) employed in the present invention is set forth herein. This program carries out the operations decribed herein with the exception of oscillating the leads back and forth in the flux and solder baths. Subsidiary overlay programs and user-definable process variable described herein can be input into the MPU 8035 chip programmer with the enclosed program.

A keyboard 160 is electrically connected to the chip 158 to input subsidiary overlay programs and user-definable process variables into the chip, such as (i) the desired solder pot temperature, (ii) the tinning time, i.e., the amount of time that the leads remain in the solder, (iii) the flux drying time, i.e., the amount of time that the leads are stationed over the solder pot during the drying stage, (iv) the tinning exit speed, i.e., the speed at which the leads are lifted from the solder, (v) the fluxing time, i.e., the amount of time that the leads are immersed in the liquid flux, and (vi) the fluxing exit speed, i.e., the rate or speed at which the leads are lifted from the liquid flux. A conventional power supply is electrically connected to the microprocessing chip 158 and the output driver 170. The power supply supplies 5 volts to the chip 158 and 24 volts to the driver 170. A temperature probe 164 (a thermocouple) is attached to the heated pot and electrically connected as an analog input into the chip 158. Location switches or sensors 54 and 56 and photoelectric units 92 are electrically connected to the digital input 166 of the chip 158. Control signals from the chip are transmitted to the output driver 170 from digital output 168 to power the various electrical devices. In actuatlity, there is a separator output driver for electro brake 72 and electro clutch 82, each clutch-brake 86, motor 98, the pot heater and the liquid flux pump. The power from the power supply 162 is supplied to each output driver 170. In the present apparatus, power transistors TIP 125 were employed as output drivers. The heater elements for the heated pot are powered by 220 volts and the output driver is connected to a power relay to supply the necessary current to the heater. The liquid flux pump is powered by 120 volts and the output driver is connected to a power relay to supply the necessary current to the pump. An additional digital output from the chip 158 is connected to a digital display 174. By the appropriate keyboard entry, the programmed pot temperature, tinning time, drying time, solder exit speed, and the like can be displayed on the display 174.

The description of the operation of the apparatus of the present invention has been described above with respect to the location of switches or sensors 54 and 56, the photoelectric units 92, brake 72 and clutch 82, the clutch-brakes 86 and the motor 98. Preferably, the microprocessor will also control the temperature of the heated pot and control the liquid flux pump. The operator selects a solder bath temperature and enters it into the keyboard as a subsidiary overlay program to the master residence program of the microprocessor 158. The microprocessor monitors the temperature of the heated pot via temperature probe 164. When the temperature of the heated pot is less than the programmed temperature, such as 2° F. below the programmed temperature, the microprocessor actuates the output of driver 170 for the heated pot heating elements which transmit a signal to a power relay (not shown) to power the heating elements. When the temperature of the heated pot exceeds the programmed temperature, the microprocessor deactuates the output of driver 170 for the heated pot heating elements (not shown) which deactuate the power relay, thus cutting off electrical current to the heating elements. The microprocessor is programmed to monitor the temperature of the heated pot continually or at desired time intervals, such as 1 second, 10 seconds, or 1 minute. The microprocessor can also be programmed to actuate or deactuate the heating elements when the temperature of the heated pot deviates from the programmed temperature by a predetermined value, such as 0.3° F., 1° F., or 3° F.

When the start button b of control panel 148 is actuated, the microprocessor 158 actuates the output driver 170 for the liquid flux electric pump via signal 168 which transmits a signal 172 to a power relay to supply electrical current to the pump.

Various user-definable process variables can be programmed or entered into the microprocessor via the keyboard 160 to carry out the various operations. For example, the soldering time, i.e., the time the leads remain in the solder, can be entered. Similarly, the drying time, i.e., the time the transport is stationed over the heated pot during the heating step, can be entered. Likewise, the solder exit speed can be entered.

Although the process and device of the present invention have been described with respect to a single embodiment, it is not intended to limit the invention to this embodiment. The process of the present invention can incorporate optional steps that are within the scope of the invention and other embodiments of the device are within the scope of the invention.

```
1. SLDM10/PCL                    (PAGE 1)
2           ; SLDM10   -
3           ; 12/27/85.
4
5           ; REG   RB0
6           ; 5     TIMER LSB
7           ; 6     TIMER MSB
8           ; 7     SEQ.
9
10          ; REG   RB1
11          ; 5     KEY BUZZ
12          ; 6     DISP P2 : - 0 - DIGIT -
13          ; 7     ACC TMP
14
15  000     R0    EQU    0
16  001     R1    EQU    1
17  002     R2    EQU    2
18  003     R3    EQU    3
19  004     R4    EQU    4
20  005     R5    EQU    5
21  006     R6    EQU    6
22  007     R7    EQU    7
23  001     P1    EQU    1
24  002     P2    EQU    2
25  038     DSBE  EQU    38H   ; EXIT
26  039     DSBS  EQU    39H   ; SOLDER
27  03B     DSBP  EQU    3BH   ; PREHEAT
28  03D     DSBF  EQU    3DH   ; TMP.
29  033     DTBE  EQU    33H   ; EXIT
30  034     DTBS  EQU    34H   ; SOLDER
31  035     DTBP  EQU    35H   ; PERHEAT
32  036     DTBF  EQU    36H   ; TMP.
33  031     TDBF  EQU    31H   ; A/D INPUT
34  02F     INBF  EQU    2FH   ; KEY INPUT
35  02E     CNLK  EQU    2EH   ; CONTROL
36  02D     INKA  EQU    2DH   ; LAST KEY
37  02C     INSW  EQU    2CH   ; SWITCH INPUT
38  02B     DSPK  EQU    2BH   ; DISP CHECK
39  02A     ADSL  EQU    2AH
                              ; A/D SEL & HEATER
40  029     CNTL  EQU    29H   ; DELAY
41  028     SPED  EQU    28H   ; DELAY SPEED
42  026     AVGH  EQU    26H   ; AVG. 0-510
43  024     AVGL  EQU    24H   ; AVG. 350-605
44  021     ABCK  EQU    21H
                ; ABORT FLAG -----,OP3,OP2,ABORT
45  020     DSLD  EQU    20H   ; LDE BUFFER
46
47  000  04 C1  BEGN  JMP    START
48  002  00           NOP
49  003  15           DIS    I
50  004  25           EN     TCNTI
51  005  04 D9        JMP    EROR
52                ;* DISPLAY
53  007  D5    DSPD   SEL    RB1
```

```
1  SLDM10/PCL                    (PAGE 2)
2
3  008  AF           MOV    R7,A
4  009  23 F4        MOV    A,#0F4H ; 1.5 MS. @ 4 MHZ
5  00B  62           MOV    T,A
6  00C  55           STRT   T
7  00D  FE           MOV    A,R6
8  00E  53 07        ANL    A,#7
9  010  96 16        JNZ    DSP1
10 012  BE 07        MOV    R6,#7   ; PRESET SCAN
11 014  04 17        JMP    DSP2
12 016  CE    DSP1   DEC    R6
13 017  0A    DSP2   IN     A,P2
14 018  53 F8        ANL    A,#0F8H
15 01A  4E           ORL    A,R6    ; SET SCAN
16 01B  99 00        ANL    P1,#0   ; CLEAR DISPLAY
17 01D  3A           OUTL   P2,A    ; OUTPUT SCAN
18 01E  53 07        ANL    A,#7
19 020  AA           MOV    R2,A
20 021  03 38        ADD    A,#DSBE
21 023  A8           MOV    R0,A
22 024  F0           MOV    A,@R0
23 025  A9           MOV    R1,A
24 026  B8 20        MOV    R0,#DSLD
25 028  F0           MOV    A,@R0
26 029  1A           INC    R2
27 02A  F7    DSP3   RLC    A
28 02B  EA 2A        DJNZ   R2,DSP3
29 02D  F9           MOV    A,R1
30 02E  F7           RLC    A
31 02F  39           OUTL   P1,A    ; OUTPUT DISPLAY
32 030  A5           CLR    F1
33 031  FD           MOV    A,R5
34 032  C6 3D        JZ     DSP6
35 034  12 3A        JB0    DSP4
36 036  9A F7        ANL    P2,#0F7H
37 038  04 3C        JMP    DSP5
38 03A  8A 08 DSP4   ORL    P2,#8
39 03C  CD    DSP5   DEC    R5
40 03D  FF    DSP6   MOV    A,R7
41 03E  93           RETR
42
43             ;* SET DISPLAY BUFFER
44 03F  B9 38 STDP   MOV    R1,#DSBE
45 041  B8 33        MOV    R0,#DTBE
46 043  F0           MOV    A,@R0
47 044  14 57        CALL   SDSP
48 046  BA 03        MOV    R2,#3
49 048  18    STD1   INC    R0
50 049  F0           MOV    A,@R0
51 04A  14 57        CALL   SDSP
52 04C  F0           MOV    A,@R0
53 04D  47           SWAP   A
```

```
SLDM10/PCL                              (PAGE 3)

04E   14 57         CALL  SDSP
050   EA 48         DJNZ  R2,STD1
052   18            INC   R0
053   F0            MOV   A,@R0
054   14 57         CALL  SDSP
056   83            RET 057   53 0F   SDSP  ANL   A,#0FH
059   03 5F         ADD   A,#TBL1
05B   A3            MOVP  A,@A
05C   A1            MOV   @R1,A
05D   19            INC   R1
05E   83            RET 05F   77      TBL1  DEFB  77H
060   12            DEFB  12H
061   6B            DEFB  6BH
062   3B            DEFB  3BH
063   1E            DEFB  1EH
064   3D            DEFB  3DH
065   7D            DEFB  7DH
066   13            DEFB  13H
067   7F            DEFB  7FH
068   1F            DEFB  1FH
069   5F            DEFB  5FH
06A   7C            DEFB  7CH
06B   65            DEFB  65H
06C   7A            DEFB  7AH
06D   6D            DEFB  6DH
06E   4D            DEFB  4DH

;* INKEY
06F   B8 2D   INKD  MOV   R0,#INKA
071   8A F0         ORL   P2,#0F0H
073   0A            IN    A,P2
074   AA            MOV   R2,A
075   37            CPL   A
076   53 F0         ANL   A,#0F0H
078   C6 93         JZ    INK2      ; NO KEY
07A   F0            MOV   A,@R0
07B   96 9B         JNZ   INK3      ; INKEY SET
07D   D5            SEL   RB1
07E   BD 20         MOV   R5,#20H
080   C5            SEL   RB0
081   B9 FF         MOV   R1,#0FFH
083   FA            MOV   A,R2
084   F7      INK1  RLC   A
085   19            INC   R1
086   F6 84         JC    INK1
088   FA            MOV   A,R2
089   A0            MOV   @R0,A     ; SET INKEY

SLDM10/PCL                              (PAGE 4)

08A   53 03         ANL   A,#3
08C   E7            RL    A
08D   E7            RL    A
08E   69            ADD   A,R1
08F   03 9D         ADD   A,#TBL3
091   A3            MOVP  A,@A
092   83            RET

093   FA      INK2  MOV   A,R2
094   D0            XRL   A,@R0
095   53 07         ANL   A,#7
097   96 9B         JNZ   INK3
099   27            CLR   A
09A   A0            MOV   @R0,A     ; RESET INKEY
09B   27      INK3  CLR   A
09C   83            RET 09D   42      TBL3  DEFB  42H       ; TEMP.
09E   43            DEFB  43H
09F   44            DEFB  44H
0A0   45            DEFB  45H
0A1   31            DEFB  31H       ; DRY
0A2   34            DEFB  34H
0A3   37            DEFB  37H
0A4   41            DEFB  41H
0A5   32            DEFB  32H       ; SOLDER
0A6   35            DEFB  35H       ; CLEAR
0A7   38            DEFB  38H
0A8   30            DEFB  30H
0A9   33            DEFB  33H       ; EXIT
0AA   36            DEFB  36H       ; ENTER
0AB   39            DEFB  39H
0AC   40            DEFB  40H

0AD   FA      ADAV  MOV   A,R2
0AE   B9 00         MOV   R1,#0
0B0   37            CPL   A
0B1   60            ADD   A,@R0
0B2   E6 B8         JNC   ADNC
0B4   B9 FF         MOV   R1,#0FFH
0B6   F2 B9         JB7   ADB7
0B8   37      ADNC  CPL   A
0B9   C8      ADB7  DEC   R0
0BA   60            ADD   A,@R0
0BB   A0            MOV   @R0,A
0BC   18            INC   R0
0BD   F9            MOV   A,R1
0BE   70            ADDC  A,@R0
0BF   A0            MOV   @R0,A
0C0   83            RET
```

```
SLDM10/PCL                    (PAGE 5)         SLDM10/PCL                    (PAGE 6)

0C1  46 D9  START  JNT1  EROR                 117  AB    CNKY   MOV   R3,A
  0C3  27           CLR   A                     118  B9 20        MOV   R1,#DSLD
  0C4  B8 00        MOV   R0,#0                 11A  F1           MOV   A,@R1
  0C6  90           MOVX  @R0,A                 11B  53 BF        ANL   A,#0BFH  ; CLEAR ACTUAL TEMP.
  0C7  54 BB        CALL  COPX                  11D  43 80        ORL   A,#80H   ; SET TEMP.
  0C9  AF           MOV   R7,A                  11F  A1           MOV   @R1,A
  0CA  B8 29        MOV   R0,#CNTL              120  FB           MOV   A,R3
  0CC  BA 17        MOV   R2,#17H               121  53 07        ANL   A,#7
  0CE  A0     STR1  MOV   @R0,A                 123  C6 98        JZ    CNK6     ; IF ENTER
  0CF  18           INC   R0                    125  07           DEC   A
  0D0  EA CE        DJNZ  R2,STR1               126  C6 93        JZ    CNKA     ; IF CLEAR
  0D2  14 3F        CALL  STDP                  128  FB           MOV   A,R3
  0D4  B8 20        MOV   R0,#DSLD              129  B8 2E        MOV   R0,#CNLK
  0D6  23 80        MOV   A,#80H                12B  20           XCH   A,@R0    ; SAVE CONTROL
  0D8  A0           MOV   @R0,A                 12C  C6 31        JZ    CNK1     ; IF FIRST CONTROL
  0D9  23 F4  EROR  MOV   A,#0F4H               12E  D0           XRL   A,@R0
  0DB  62           MOV   T,A                   12F  C6 DA        JZ    KYEX     ; SAME CONTROL
  0DC  25           EN    TCNTI                              ; CLEAR INPUT BUFFER
  0DD  55           STRT  T                     131  B8 2F  CNK1  MOV   R0,#INBF
  0DE  74 00  LOOP  CALL  ADIN                  133  27           CLR   A
  0E0  34 00        CALL  KYBD                  134  A0           MOV   @R0,A
  0E2  B9 20        MOV   R1,#DSLD              135  18           INC   R0
  0E4  F1           MOV   A,@R1                 136  A0           MOV   @R0,A
  0E5  37           CPL   A                     137  14 3F        CALL  STDP     ; RESTORE DISPLAY
  0E6  B2 DE        JB5   LOOP  ; NOT READY     139  B8 2E  CNK2  MOV   R0,#CNLK
  0E8  26 EC        JNT0  CLOP                  13B  F0           MOV   A,@R0
  0EA  94 00        CALL  ABRT                  13C  C6 DA        JZ    KYEX
  0EC  B8 01  CLOP  MOV   R0,#1                 13E  03 FE        ADD   A,#0FEH  ; -2
  0EE  B9 2C        MOV   R1,#INSW              140  53 03        ANL   A,#3     ; MASK
  0F0  80           MOVX  A,@R0                 142  03 45        ADD   A,#TBL4  ; OFFSET
  0F1  D3 FF        XRL   A,#0FFH               144  B3           JMPP  @A
  0F3  A1           MOV   @R1,A
  0F4  44 24        JMP   SQDC                  145  49    TBL4   DEFB  CKY2     ; TMP.
                                                146  5C           DEFB  CKY3     ; PREHEAT
              ORG   100H                        147  64           DEFB  CKY4     ; SOLDER
  100  14 6F  KYBD  CALL  INKD                  148  75           DEFB  CKY5     ; EXIT
  102  C6 DA        JZ    KYEX
  104  D2 17        JB6   CNKY  ; CONTROL       149  BB 08  CKY2  MOV   R3,#8
         ; 0-9 (KEY)                            14B  B9 3D        MOV   R1,#DSBF
  106  B8 2F        MOV   R0,#INBF              14D  B8 2F        MOV   R0,#INBF
  108  20           XCH   A,@R0                 14F  F0           MOV   A,@R0
  109  47           SWAP  A                     150  14 57        CALL  SDSP
  10A  30           XCHD  A,@R0                 152  F0           MOV   A,@R0
  10B  20           XCH   A,@R0                 153  47           SWAP  A
  10C  18           INC   R0                    154  14 57        CALL  SDSP
  10D  53 0F        ANL   A,#0FH                156  18           INC   R0
  10F  A0           MOV   @R0,A                 157  F0           MOV   A,@R0
  110  B8 2E        MOV   R0,#CNLK              158  14 57        CALL  SDSP
  112  F0           MOV   A,@R0                 15A  24 D3        JMP   CNK9
  113  C6 82        JZ    KY0C
                     ; USE FOR OTHER CONTROLS
  115  24 39        JMP   CNK2
```

```
SLDM10/PCL                              (PAGE 7)         SLDM10/PCL                              (PAGE 8)

3  15C  BB 04  CKY3  MOV   R3,#4                  3  1A6  C1           DEFB  CKL3     ; PREHEAT
 4  15E  BA 03        MOV   R2,#3                  4  1A7  C5           DEFB  CKL4     ; SOLDER
 5  160  B9 3B        MOV   R1,#DSBP               5  1A8  C9           DEFB  CKL5     ; EXIT
 6  162  24 6A        JMP   CNK3                   6
 7                                                 7  1A9  B9 36  CKL2  MOV   R1,#DTBF
 8  164  BB 02  CKY4  MOV   R3,#2                  8  1AB  B8 2F        MOV   R0,#INBF
 9  166  BA 0C        MOV   R2,#0CH                9  1AD  F0           MOV   A,@R0
10  168  B9 39        MOV   R1,#DSBS              10  1AE  A1           MOV   @R1,A
11  16A  B8 2F  CNK3  MOV   R0,#INBF              11  1AF  18           INC   R0
12  16C  F0           MOV   A,@R0                 12  1B0  19           INC   R1
13  16D  14 57        CALL  SDSP                  13  1B1  F0           MOV   A,@R0
14  16F  F0           MOV   A,@R0                 14  1B2  03 FA        ADD   A,#0FAH
15  170  47           SWAP  A                     15  1B4  E6 BE        JNC   CKN0
16  171  14 57        CALL  SDSP                  16  1B6  C9           DEC   R1
17  173  24 D3        JMP   CNK9                  17  1B7  27           CLR   A
18                                                18  1B8  A1           MOV   @R1,A
19  175  BB 01  CKY5  MOV   R3,#1                 19  1B9  19           INC   R1
20  177  BA 30        MOV   R2,#30H               20  1BA  23 06        MOV   A,#6
21  179  B9 38        MOV   R1,#DSBE              21  1BC  24 CE        JMP   CNK8
22  17B  B8 2F        MOV   R0,#INBF              22
23  17D  F0           MOV   A,@R0                 23  1BE  F0    CKN0   MOV   A,@R0
24  17E  14 57        CALL  SDSP                  24  1BF  24 CE        JMP   CNK8
25  180  24 D3        JMP   CNK9                  25
26                                                26  1C1  B9 35  CKL3  MOV   R1,#DTBP
27  182  B8 2F  KYOC  MOV   R0,#INBF              27  1C3  24 CB        JMP   CNK7
28  184  F0           MOV   A,@R0                 28
29  185  53 0F        ANL   A,#0FH                29  1C5  B9 34  CKL4  MOV   R1,#DTBS
30  187  B9 2B        MOV   R1,#DSPK              30  1C7  24 CB        JMP   CNK7
31  189  A1           MOV   @R1,A                 31
32  18A  B9 20        MOV   R1,#DSLD              32  1C9  B9 33  CKL5  MOV   R1,#DTBE
33  18C  F1           MOV   A,@R1                 33  1CB  B8 2F  CNK7  MOV   R0,#INBF
34  18D  53 7F        ANL   A,#07FH               34  1CD  F0           MOV   A,@R0
35  18F  43 40        ORL   A,#40H ; SET DISP. A/D 35 1CE  A1    CNK8   MOV   @R1,A
36  191  A1           MOV   @R1,A                 36  1CF  14 3F        CALL  STDP     ; SET DISPLAY
37  192  83           RET                         37  1D1  BB 00        MOV   R3,#0
38                                                38  1D3  B8 20  CNK9  MOV   R0,#DSLD
39             ;* CLEAR                           39  1D5  F0           MOV   A,@R0
40  193  B9 2E  CNKA  MOV   R1,#CNLK              40  1D6  53 F0        ANL   A,#0F0H
41  195  27           CLR   A                     41  1D8  4B           ORL   A,R3     ; SET LED DISP.
42  196  24 CE        JMP   CNK8                  42  1D9  A0           MOV   @R0,A
43             ;* ENTER                           43  1DA  83    KYEX   RET
44  198  B9 2E  CNK6  MOV   R1,#CNLK              44
45  19A  27           CLR   A                     45                    ORG   200H
46  19B  21           XCH   A,@R1                 46  200  2A    TBL6   DEFB  CN00     ; 0
47  19C  C6 CE        JZ    CNK8                  47  201  81           DEFB  CRP0     ; 1
48  19E  03 FE        ADD   A,#0FEH ; -2          48  202  81           DEFB  CRP0     ; 2
49  1A0  53 03        ANL   A,#3                  49  203  85           DEFB  CRP5     ; 3
50  1A2  03 A5        ADD   A,#TBL5               50  204  85           DEFB  CRP5     ; 4
51  1A4  B3           JMPP  @A                    51  205  89           DEFB  CFP0     ; 5
52                                                52  206  89           DEFB  CFP0     ; 6
53  1A5  A9    TBL5   DEFB  CKL2   ; TMP.         53  207  8D           DEFB  CFPA     ; 7
```

```
1    SLDM10/PCL                           (PAGE  9)
2
3    208   8D         DEFB  CFPA    ;  8
4    209   44         DEFB  CSFD    ;  9
5    20A   6B         DEFB  CDLY    ; 10
6    20B   3C         DEFB  CFM3    ; 11
7    20C   56         DEFB  CSPH    ; 12
8    20D   6B         DEFB  CDLY    ; 13
9    20E   56         DEFB  CSPH    ; 14
10   20F   6B         DEFB  CDLY    ; 15
11   210   79         DEFB  CRM2    ; 16
12   211   3C         DEFB  CFM3    ; 17
13   212   AF         DEFB  CSVS    ; 18
14   213   95         DEFB  CRVO    ; 19
15   214   95         DEFB  CRVO    ; 20
16   215   9B         DEFB  CRV5    ; 21
17   216   9B         DEFB  CRV5    ; 22
18   217   4D         DEFB  CSSD    ; 23
19   218   6B         DEFB  CDLY    ; 24
20   219   AF         DEFB  CSVS    ; 25
21   21A   A3         DEFB  CFVO    ; 26
22   21B   A3         DEFB  CFVO    ; 28
23   21C   A7         DEFB  CFVA    ; 29
24   21D   A7         DEFB  CFVA    ; 30
25   21E   79         DEFB  CRM2    ; 31
26   21F   B4         DEFB  COFF    ; 32
27
28   220   8D    ASQ2 DEFB  CFPA    ; 33
29   221   8D         DEFB  CFPA    ; 34
30   222   79    ASQ1 DEFB  CRM2    ; 35
31   223   B4         DEFB  COFF    ; 36
32
33   224   FF    SQDC MOV   A,R7
34   225   53 3F      ANL   A,#3FH
35   227   03 00      ADD   A,#TBL6
36   229   B3         JMPP  @A
37
38   22A   B8 21 CN00 MOV   R0,#ABCK
39   22C   F0         MOV   A,@R0
40   22D   53 FE      ANL   A,#0FEH
                                        ; CLEAR ABORT FLAG
41   22F   A0         MOV   @R0,A
42   230   F1         MOV   A,@R1
43   231   37         CPL   A
44   232   F2 3A      JB7   CNEX
45   234   D3 55      XRL   A,#55H
46   236   96 3A      JNZ   CNEX
47   238   BF 01      MOV   R7,#1
48   23A   04 DE CNEX JMP  LOOP
49
50   23C   23 09 CFM3 MOV  A,#9
51   23E   54 BB      CALL  COPX
52   240   23 40      MOV   A,#40H
53   242   84 86      JMP   CNSN

1    SLDM10/PCL                           (PAGE 10)
2
3
4    244   B9 28 CSFD MOV   R1,#SPED
5    246   23 A7      MOV   A,#0A7H
6    248   A1         MOV   @R1,A
7    249   23 0E      MOV   A,#0EH
8    24B   44 62      JMP   CSSF
9    24D   B9 28 CSSD MOV   R1,#SPED
10   24F   23 21      MOV   A,#21H   ; .1 SEC.
11   251   A1         MOV   @R1,A
12   252   B9 34      MOV   R1,#DTBS
13   254   44 5D      JMP   CNL4
14   256   B9 28 CSPH MOV   R1,#SPED
15   258   23 A7      MOV   A,#0A7H  ; .5 SEC.
16   25A   A1         MOV   @R1,A
17   25B   B9 35      MOV   R1,#DTBP
18   25D   F1    CNL4 MOV   A,@R1
19   25E   94 45      CALL  BCDC
20   260   E7         RL    A
21   261   17         INC   A
22   262   AE    CSSF MOV   R6,A
23   263   BD 01      MOV   R5,#1
24   265   27         CLR   A
25   266   54 BB      CALL  COPX
26   268   1F         INC   R7
27   269   04 DE      JMP   LOOP
28
29   26B   76 77 CDLY JF1   CNE5
30   26D   B5         CPL   F1
31   26E   ED 77      DJNZ  R5,CNE5
32   270   B9 28      MOV   R1,#SPED
33   272   F1         MOV   A,@R1
34   273   AD         MOV   R5,A
35   274   EE 77      DJNZ  R6,CNE5
36   276   1F         INC   R7
37   277   04 DE CNE5 JMP   LOOP
38
39   279   23 19 CRM2 MOV   A,#19H
40   27B   54 BB      CALL  COPX
41   27D   23 20      MOV   A,#20H
42   27F   84 86      JMP   CNSN
43
44   281   BA 00 CRP0 MOV   R2,#0
45   283   84 8E      JMP   CNRS
46
47   285   BA 05 CRP5 MOV   R2,#5
48   287   84 8E      JMP   CNRS
49
50   289   BA 00 CFP0 MOV   R2,#0
51   28B   84 92      JMP   CNFS
52
53   28D   BA 0A CFPA MOV   R2,#0AH
```

```
SLDM10/PCL                      (PAGE 11)

3  28F  84 92        JMP   CNFS
 4
 5  291  BA 0F  CRPF  MOV   R2,#0FH
 6  293  84 8E        JMP   CNRS
 7
 8  295  BA 00  CRV0  MOV   R2,#0
 9  297  84 B2        JMP   CVRS
10  299  94 5F        CALL  CNSP
11
12  29B  BA 05  CRV5  MOV   R2,#5
13  29D  84 B2        JMP   CVRS
14
15  29F  BA 0A  CRVF  MOV   R2,#0AH
16  2A1  84 B2        JMP   CVRS
17
18  2A3  BA 00  CFV0  MOV   R2,#0
19  2A5  84 B6        JMP   CVFS
20
21  2A7  BA 0A  CFVA  MOV   R2,#0AH
22  2A9  84 B6        JMP   CVFS
23
24  2AB  BA FF  CFVF  MOV   R2,#0FFH
25  2AD  84 B6        JMP   CVFS
26
27  2AF  94 6A  CSVS  CALL  CNNP
28  2B1  1F           INC   R7
29  2B2  04 DE        JMP   LOOP
30
31  2B4  27     COFF  CLR   A
32  2B5  54 BB        CALL  COPX
33  2B7  BF 00        MOV   R7,#0
34  2B9  04 DE        JMP   LOOP
35
36  2BB  B8 21  COPX  MOV   R0,#ABCK
37  2BD  20           XCH   A,@R0
38  2BE  32 C3        JB1   COPS
39  2C0  20           XCH   A,@R0
40  2C1  44 C6        JMP   COPN
41  2C3  20     COPS  XCH   A,@R0
42  2C4  43 20        ORL   A,#20H
43  2C6  B8 00  COPN  MOV   R0,#OPCK
44  2C8  A0           MOV   @R0,A
45  2C9  B8 01        MOV   R0,#1
46  2CB  90           MOVX  @R0,A
47  2CC  83           RET
48
49                    ORG   300H
50  300  86 04  ADIN  JNI   ADDA
51  302  64 8B        JMP   HEXT
52  304  B8 24  ADDA  MOV   R0,#AV6L
53  306  B9 2A        MOV   R1,#ADSL
```

```
SLDM10/PCL                      (PAGE 12)

3  308  F1           MOV   A,@R1
 4  309  12 0D        JB0   ADPT
 5  30B  18           INC   R0
 6  30C  18           INC   R0
 7  30D  D3 01  ADPT  XRL   A,#1
 8  30F  A1           MOV   @R1,A
 9  310  AA           MOV   R2,A
10  311  B9 00        MOV   R1,#0
11  313  81           MOVX  A,@R1
12  314  2A           XCH   A,R2
13  315  91           MOVX  @R1,A
14  316  14 AD        CALL  ADAV
15  318  B9 29        MOV   R1,#CNTL
16  31A  11           INC   @R1
17  31B  F1           MOV   A,@R1
18  31C  96 47        JNZ   HETM
19  31E  B8 26        MOV   R0,#AV6H
20  320  F0           MOV   A,@R0
21  321  03 4C        ADD   A,#4CH
22  323  E6 99        JNC   ADJL
23  325  B8 24        MOV   R0,#AV6L
24  327  F0     AV5L  MOV   A,@R0
25  328  94 23        CALL  BINC
26  32A  B9 26        MOV   R1,#AV6H
27  32C  B8 31        MOV   R0,#TDBF
28  32E  F1           MOV   A,@R1
29  32F  03 4C        ADD   A,#4CH
30  331  F6 3D        JC    ADP5
31
32  333  FB           MOV   A,R3    ; INPUT X 2
33  334  6B           ADD   A,R3
34  335  57           DA    A
35  336  A0           MOV   @R0,A
36  337  18           INC   R0
37  338  FC           MOV   A,R4
38  339  7C           ADDC  A,R4
39  33A  A0           MOV   @R0,A
40  33B  64 47        JMP   HETM
41
42  33D  FB     ADP5  MOV   A,R3    ; INPUT + 350
43  33E  03 50        ADD   A,#50H
44  340  57           DA    A
45  341  A0           MOV   @R0,A
46  342  18           INC   R0
47  343  23 03        MOV   A,#3
48  345  7C           ADDC  A,R4
49  346  A0           MOV   @R0,A
50
51  347  B9 20  HETM  MOV   R1,#DSLD
52  349  F1           MOV   A,@R1
53  34A  F2 4E        JB7   HEMT
```

```
  SLDM10/PCL                    (PAGE 13)            SLDM10/PCL                     (PAGE 14)

34C   B4 00        CALL  HEDS                      392   B9 20        MOV   R1,#DSLD
                                                     394   F1           MOV   A,@R1
  34E   B8 31  HEMT  MOV   R0,#TDBF; INPUT            395   43 10        ORL   A,#10H ; HEATER LED ON
  350   B9 36        MOV   R1,#DTBF; REF.             397   A1           MOV   @R1,A
  352   F1           MOV   A,@R1                      398   83           RET
  353   AA           MOV   R2,A
  354   19           INC   R1                         399   C4 C0  ADJL  JMP   ADTB
  355   F1           MOV   A,@R1
  356   AB           MOV   R3,A                                          ORG   400H
  357   B9 20        MOV   R1,#DSLD                   400   B9 21  ABRT  MOV   R1,#ABCK
  359   F1           MOV   A,@R1                      402   F1           MOV   A,@R1
  35A   92 68        JB4   HEMS                       403   12 22        JB0   AB1F
  35C   23 98        MOV   A,#98H  ; -2               405   43 01        ORL   A,#1
  35E   6A           ADD   A,R2                       407   A1           MOV   @R1,A
  35F   57           DA    A                          408   B9 01        MOV   R1,#1
  360   AA           MOV   R2,A                       40A   81           MOVX  A,@R1
  361   F6 68        JC    HEMS                       40B   37           CPL   A
  363   FB           MOV   A,R3                       40C   B2 1A        JB5   AB1X
  364   C6 8B        JZ    HEXT                       40E   D3 0A        XRL   A,#0AH
  366   07           DEC   A                          410   53 0F        ANL   A,#0FH
  367   AB           MOV   R3,A                       412   C6 17        JZ    ABXA
  368   F0    HEMS   MOV   A,@R0                      414   BF 20        MOV   R7,#AS02
  369   37           CPL   A                          416   83           RET
  36A   6A           ADD   A,R2                       417   BF 22  ABXA  MOV   R7,#AS01
  36B   18           INC   R0                         419   83           RET
  36C   F0           MOV   A,@R0                      41A   D3 0A  AB1X  XRL   A,#0AH
  36D   37           CPL   A                          41C   53 0F        ANL   A,#0FH
  36E   7B           ADDC  A,R3                       41E   C6 22        JZ    AB1F
  36F   F6 8C        JC    HEON                       420   BF 20        MOV   R7,#AS02
  371   B9 2A        MOV   R1,#ADSL                   422   83    AB1F   RET
  373   F1           MOV   A,@R1
  374   53 01        ANL   A,#1                                          ;* BINARY TO BCD
  376   A1           MOV   @R1,A  ; HEATER OFF        423   AB    BINC   MOV   R3,A
  377   B9 20        MOV   R1,#DSLD                   424   53 0F        ANL   A,#0FH
  379   F1           MOV   A,@R1                      426   03 00        ADD   A,#0
  37A   53 EF        ANL   A,#0EFH ; HEATER LED OFF   428   57           DA    A
  37C   A1           MOV   @R1,A                      429   2B           XCH   A,R3
  37D   FB           MOV   A,R3                       42A   BC 00        MOV   R4,#0
  37E   96 85        JNZ   HECI                       42C   BA 04        MOV   R2,#4
  380   FA           MOV   A,R2                       42E   B8 41        MOV   R0,#TBL2
  381   53 F0        ANL   A,#0F0H                    430   F7    BIN1   RLC   A
  383   C6 8B        JZ    HEXT                       431   E6 3D        JNC   BIN3
  385   B9 20  HECI  MOV   R1,#DSLD                   433   A9           MOV   R1,A
  387   F1           MOV   A,@R1                      434   F8           MOV   A,R0
  388   43 20        ORL   A,#20H ; SET READY FLAG    435   A3           MOVP  A,@A
  38A   A1           MOV   @R1,A                      436   6B           ADD   A,R3
  38B   83    HEXT   RET                              437   57           DA    A
                                                     438   E6 3B        JNC   BIN2
  38C   B9 2A  HEON  MOV   R1,#ADSL                   43A   1C           INC   R4
  38E   F1           MOV   A,@R1                      43B   AB    BIN2   MOV   R3,A
  38F   43 10        ORL   A,#10H                     43C   F9           MOV   A,R1
  391   A1           MOV   @R1,A
```

```
  SLDM10/PCL                    (PAGE 15)        SLDM10/PCL                    (PAGE 16)

43D   18       BIN3  INC   R0
  43E   EA 30          DJNZ  R2,BIN1              47C   0A       TBL7  DEFB  0AH
  440   83             RET                        47D   0C             DEFB  0CH
                                                  47E   0E             DEFB  0EH
  441   C8       TBL2  DEFB  0C8H                 47F   10             DEFB  10H
  442   64             DEFB  64H                  480   12             DEFB  12H
  443   32             DEFB  32H                  481   14             DEFB  14H
  444   16             DEFB  16H                  482   16             DEFB  16H
                                                  483   18             DEFB  18H
              ;* BCD TO BINARY                    484   1A             DEFB  1AH
  445   AB       BCDC  MOV   R3,A                 485   1C             DEFB  1CH
  446   53 0F          ANL   A,#0FH
  448   2B             XCH   A,R3                 486   D1       CNSN  XRL   A,@R1
  449   BA 04          MOV   R2,#4                487   53 70          ANL   A,#70H
  44B   B8 5B          MOV   R0,#TBL9             489   96 8C          JNZ   CNEN
  44D   F7       BCD1  RLC   A                    48B   1F       CNPI  INC   R7
  44E   E6 56          JNC   BCD2                 48C   04 DE    CNEN  JMP   LOOP
  450   A9             MOV   R1,A
  451   FB             MOV   A,R0                 48E   BB 18    CNRS  MOV   R3,#18H
  452   A3             MOVP  A,@A                 490   84 94          JMP   CNPS
  453   6B             ADD   A,R3                 492   BB 08    CNFS  MOV   R3,#8
  454   AB             MOV   R3,A                 494   BC 00    CNPS  MOV   R4,#0
  455   F9             MOV   A,R1                 496   F1             MOV   A,@R1
  456   18       BCD2  INC   R0                   497   DA             XRL   A,R2
  457   EA 4D          DJNZ  R2,BCD1              498   53 0F          ANL   A,#0FH
  459   FB             MOV   A,R3                 49A   C6 BB          JZ    CNPI
  45A   83             RET                        49C   AA             MOV   R2,A
                                                  49D   53 03          ANL   A,#3
  45B   50       TBL9  DEFB  50H                  49F   C6 A3          JZ    CNPH
  45C   28             DEFB  28H                  4A1   BC 04          MOV   R4,#4
  45D   14             DEFB  14H                  4A3   FA       CNPH  MOV   A,R2
  45E   0A             DEFB  0AH                  4A4   53 0C          ANL   A,#0CH
                                                  4A6   C6 AC          JZ    CNPL
  45F   76 7B    CNSP  JF1   CNEP                 4A8   FC             MOV   A,R4
  461   B5             CPL   F1                   4A9   43 02          ORL   A,#2
  462   B6 66          JF0   CNOF                 4AB   AC             MOV   R4,A
  464   43 08          ORL   A,#8                 4AC   FC       CNPL  MOV   A,R4
  466   54 BB    CNOF  CALL  COPX                 4AD   4B             ORL   A,R3
  468   ED 78          DJNZ  R5,CNCP              4AE   54 BB          CALL  COPX
  46A   B9 33    CNNP  MOV   R1,#DTBE             4B0   04 DE          JMP   LOOP
  46C   F1             MOV   A,@R1
  46D   53 0F          ANL   A,#0FH               4B2   BB 10    CVRS  MOV   R3,#10H
  46F   03 7C          ADD   A,#TBL7              4B4   84 B8          JMP   CVPS
  471   A3             MOVP  A,@A                 4B6   BB 00    CVFS  MOV   R3,#0
  472   AE             MOV   R6,A                 4B8   BC 00    CVPS  MOV   R4,#0
  473   B9 2C          MOV   R1,#INSW             4BA   F1             MOV   A,@R1
  475   BD 40          MOV   R5,#40H              4BB   DA             XRL   A,R2
  477   85             CLR   F0                   4BC   53 0F          ANL   A,#0FH
  478   EE 7B    CNCP  DJNZ  R6,CNEP              4BE   C6 BB          JZ    CNPI
  47A   95             CPL   F0                   4C0   AA             MOV   R2,A
  47B   83       CNEP  RET                        4C1   53 03          ANL   A,#3
```

```
SLDM10/PCL                    (PAGE 17)

3  4C3  C6 C7        JZ     CVPH
 4  4C5  BC 04        MOV    R4,#4
 5  4C7  FA    CVPH   MOV    A,R2
 6  4C8  53 0C        ANL    A,#0CH
 7  4CA  C6 D0        JZ     CVPL
 8  4CC  FC           MOV    A,R4
 9  4CD  43 02        ORL    A,#2
10  4CF  AC           MOV    R4,A
11  4D0  FC    CVPL   MOV    A,R4
12  4D1  4B           ORL    A,R3
13  4D2  94 5F        CALL   CNSP
14  4D4  04 DE        JMP    LOOP
15
16                    ORG    500H
17  500  B8 2B HEDS   MOV    R0,#DSPK
18  502  F0           MOV    A,@R0
19  503  53 0F        ANL    A,#0FH
20  505  03 08        ADD    A,#TBL8
21  507  B3           JMPP   @A
22
23  508  43    TBL8   DEFB   HEDP    ; 0
24  509  54           DEFB   HDM1    ; 1
25  50A  58           DEFB   HDM2    ; 2
26  50B  6B           DEFB   HDM3    ; 3
27  50C  15           DEFB   HEAH    ; 4
28  50D  19           DEFB   HEAL    ; 5
29  50E  12           DEFB   HER7    ; 6
30  50F  31           DEFB   HEIS    ; 7
31  510  7E           DEFB   HDM4    ; 8
32  511  7E           DEFB   HDM4    ; 9
33
34  512  FF    HER7   MOV    A,R7
35  513  A4 1C        JMP    HED7
36  515  B8 26 HEAH   MOV    R0,#AVGH
37  517  A4 1B        JMP    HEDH
38  519  B8 24 HEAL   MOV    R0,#AVGL
39  51B  F0    HEDH   MOV    A,@R0
40  51C  94 23 HED7   CALL   BINC
41  51E  B9 3D        MOV    R1,#DSBF
42  520  FB           MOV    A,R3
43  521  14 57        CALL   SDSP
44  523  FB           MOV    A,R3
45  524  47           SWAP   A
46  525  14 57        CALL   SDSP
47  527  FC           MOV    A,R4
48  528  14 57        CALL   SDSP
49  52A  B9 20 HEDC   MOV    R1,#DSLD; CLEAR LED
50  52C  F1           MOV    A,@R1
51  52D  53 BF        ANL    A,#0BFH
52  52F  A1           MOV    @R1,A
53  530  83           RET

SLDM10/PCL                    (PAGE 18)

; DISP. INPUT SWITCH
 5  531  B8 01 HEIS   MOV    R0,#1
 6  533  B9 3D        MOV    R1,#DSBF
 7  535  80           MOVX   A,@R0
 8  536  D3 FF        XRL    A,#0FFH
 9  538  14 57        CALL   SDSP
10  53A  80           MOVX   A,@R0
11  53B  47           SWAP   A
12  53C  14 57        CALL   SDSP
13  53E  23 00        MOV    A,#0
14  540  A1           MOV    @R1,A
15  541  A4 2A        JMP    HEDC
16
17                 ; DISP. ACTUAL TEMP.
18  543  B8 31 HEDP   MOV    R0,#TDBF
19  545  B9 3D        MOV    R1,#DSBF
20  547  F0           MOV    A,@R0
21  548  14 57        CALL   SDSP
22  54A  F0           MOV    A,@R0
23  54B  47           SWAP   A
24  54C  14 57        CALL   SDSP
25  54E  18           INC    R0
26  54F  F0           MOV    A,@R0
27  550  14 57        CALL   SDSP
28  552  64 4E        JMP    HEMT
29
30                 ; DISP./SEL. MOD
31  554  B8 96 HDM1   MOV    R0,#DTB1
32  556  A4 89        JMP    HDMC
33
34  558  B8 99 HDM2   MOV    R0,#DTB2
35  55A  B9 21        MOV    R1,#ABCK
36  55C  F1           MOV    A,@R1
37  55D  43 02        ORL    A,#2
38  55F  A1           MOV    @R1,A
39  560  23 20        MOV    A,#20H
40  562  B9 00        MOV    R1,#OPCK
41  564  41           ORL    A,@R1
42  565  A1           MOV    @R1,A
43  566  B9 01        MOV    R1,#1
44  568  91           MOVX   @R1,A
45  569  A4 89        JMP    HDMC
46
47  56B  B8 9C HDM3   MOV    R0,#DTB3
48  56D  B9 21        MOV    R1,#ABCK
49  56F  F1           MOV    A,@R1
50  570  53 FD        ANL    A,#0FDH
51  572  A1           MOV    @R1,A
52  573  23 DF        MOV    A,#0DFH
53  575  B9 00        MOV    R1,#OPCK
```

```
1   SLDM10/PCL                        (PAGE 19)
2
3   577  51           ANL   A,@R1
4   578  A1           MOV   @R1,A
5   579  B9 01        MOV   R1,#1
6   57B  91           MOVX  @R1,A
7   57C  A4 89        JMP   HDMC
8
9   57E  B9 21  HDM4  MOV   R1,#ABCK
10  580  F1           MOV   A,@R1
11  581  32 87        JB1   HDS4
12  583  B8 9C        MOV   R0,#DTB3
13  585  A4 89        JMP   HDMC
14  587  B8 99  HDS4  MOV   R0,#DTB2
15  589  BA 03  HDMC  MOV   R2,#3
16  58B  B9 3D        MOV   R1,#DSBF
17  58D  F8     HDLP  MOV   A,R0
18  58E  A3           MOVP  A,@A
19  58F  A1           MOV   @R1,A
20  590  18           INC   R0
21  591  19           INC   R1
22  592  EA 8D        DJNZ  R2,HDLP
23  594  A4 2A        JMP   HEDC
24
25  596  77     DTB1  DEFB  77H      ; 0
26  597  12           DEFB  12H      ; 1
27  598  08           DEFB  08H      ; -
28  599  00     DTB2  DEFB  00H      ;
29  59A  58           DEFB  58H      ; N
30  59B  77           DEFB  77H      ; 0
31  59C  4D     DTB3  DEFB  4DH      ; F
32  59D  4D           DEFB  4DH      ; F
33  59E  77           DEFB  77H      ; 0
34
35                    ORG   6C0H
36  6C0  00     ADTB  NOP
37
38                    END
```

What is claimed is:

1. A process for tinning the leads of electronic components comprising the steps of:
   (a) applying a flux coating to the leads of electronic components by immersing said leads into liquid flux, longitudinally moving said leads in said liquid flux, and removing said leads from said liquid flux;
   (b) drying the flux coating on said leads by positioning the leads over a hot molten tinning bath;
   (c) tinning the leads by immersing the leads in the hot molten solder in the tinning bath; and
   (d) lifting the tinned leads from the hot molten solder in the tinning bath.

2. The process according to claim 1 wherein the flux coating is applied to said leads by lowering said leads into said liquid flux, longitudinally moving said leads in said liquid flux, and lifting said leads from said liquid flux.

3. The process according to claim 1 wherein said leads are longitudinally moved in said tinning bath when said leads are lifted from said bath.

4. The process according to claim 2 wherein said leads are longitudinally moved in said liquid flux when said leads are lifted from said bath.

5. The process according to claim 1 wherein said leads are oscillated in the tinning bath before said leads are lifted from the tinning bath.

6. The process according to claim 2 wherein said leads are oscillated in the liquid flux before said leads are lifted from the liquid flux.

7. A process for tinning electronic component leads comprising the steps of:
   (a) applying a flux coating to the leads of electronic components by immersing said leads into liquid flux, longitudinally moving said leads in said liquid flux, and lifting said leads from said liquid flux;
   (b) drying the flux coating by positioning said leads over a hot molten tinning bath;
   (c) tinning said leads by lowering and longitudinally moving said leads into the hot molten tinning bath to immerse said leads in the tinning bath; and
   (d) lifting and longitudinally moving the tinned leads from the tinning bath and permitting the excess hot molten solder to drain from the tinned leads.

8. The process according to claim 7 wherein said leads are lowered into and longitudinally moved in said liquid flux to immerse said leads into said liquid flux.

9. The process according to claim 7 wherein said leads are longitudinally moved in said liquid flux when said leads are lifted from said bath.

10. The process according to claim 7 wherein said leads are oscillated in the tinning bath before said leads are lifted from the tinning bath.

11. An electronic component tinning apparatus comprising the following elements:
   (a) a longitudinal base unit having two longitudinally extending sides connected to a first end and an opposing second end, a top portion connected to and bounded by said sides and ends with an open longitudinal central cavity, and two spaced-apart, parallel longitudinally extending rails mounted on the top portion on opposing sides of said central cavity;
   (b) a flux tank mounted in said central cavity approximate said first end to hold a liquid flux for flux-coating electronic component leads;
   (c) a heated pot mounted in said central cavity approximate said second end to hold a hot molten solder bath for tinning the electronic component leads;
   (d) a powered, wheeled electronic-component transport adapted to ride on said rails to carry electronic components from said first end across the flux tank to the second end over said solder pot and back again;
   (e) two powered cam means mounted in said transport, rotatable to a high transport position and a low processing position, said cam means adapted to carry and vertically move an electronic-component carrier to the high transport position and the low tinning position;
   (f) first sensing means to detect the position of said transport on said base unit;
   (g) second sensing means to detect the position of each of said cam means; and
   (h) control means connected to said first and second sensing means to receive signals therefrom and connected to said powered transport and said powered cam means to send control signals thereto.

12. The apparatus of claim 11 wherein said control means is a programmable microprocessor chip programmed with a master residence program adapted to receive a subsidiary overlay program to monitor and control the temperature of said heated pot and user-definable process variables to move and station said transport over said heated pot for a predetermined time to tin the leads of the electronic components, to lower the leads of the electronic components into the molten solder, to lift the leads from the molten solder after a predetermined time.

13. The apparatus according to claim 11 wherein said control means is a programmable microprocessor chip programmed with a master residence program adapted to receive a subsidiary overlay program to monitor and control circulation of the liquid flux.

14. The apparatus according to claim 11 wherein said control means, upon being actuated and with said transport in a start position over said flux tank with said cam means in a transport position, commands said first and second cam means to rotate to lower the carrier to said low processing position to immerse the leads of the electronic components into the liquid flux to flux-coat the leads, and commands said first and second cam means to rotate to lift the carrier to said transport position to lift the leads from the flux;
  in a second step, commands said transport to move from the position over the flux tank to a position over said heated pot, for a predetermined time to dry the flux coating on the leads;
  in a third step, commands said first and second cam means to rotate to lower said carrier to said low processing position to dip the leads into the hot molten solder bath for a predetermined length of time, and then commands said cam means to rotate to lift said carrier to a transport position to lift the tinned leads from said molten solder bath; and
  in a fourth step, commands said transport to move to said start position.

15. The apparatus of claim 14 wherein the control means in the first step commands both cam means to rotate to said low processing position so that said carrier is lowered in a level orientation.

16. The apparatus according to claim 15 wherein the control means in the first step commands both cam means, after the carrier has been lowered to said low processing position for a predetermined time, to move to said transport position so that said carrier is lifted in a level orientation.

17. The apparatus according to claim 14 wherein the control means in the third step commands both cam means, after the transport has been moved to a position over said heated pot, to move to said low processing position so that said carrier is lowered in a level orientation.

18. The process according to claim 17 wherein the control means in the third step commands both cam means, after the carrier has been lowered to said low processing position for a predetermined length of time, to move to said transport position so that said carrier is lifted in a level orientation.

19. The apparatus according to claim 11 wherein said first sensing means detects the position of said transport when it is positioned over said flux tank and over said heated pot; and said second means detects the position of each of said cam means when said cam means are in the transport position and the low processing position.

20. The apparatus according to claim 11 wherein the flux tank means comprises a circulating constant-level flux tank having a large liquid flux reservoir for fluxing electronic component leads and an overflow reservoir connected to the large reservoir and separated therefrom by an overflow weir, a liquid flux storage tank in fluid communication with said overflow reservoir to receive liquid flux from said overflow reservoir, and a pump means in fluid communication with said storage tank and large reservoir to pump liquid flux from said storage tank to said large reservoir.

21. The apparatus according to claim 11 wherein said control means is a programmable microprocessor chip programmed with a master residence program adapted to receive the subsidiary overlay program to monitor and control said pump means.

22. The apparatus according to claim 11 wherein said control means is a programmable microprocessor chip programmed with a master residence program adapted to receive a subsidiary overlay program to monitor and control the temperature of said heated pot and the operation of said pump means and user-definable variables to move the transport to a station over said flux tank, to rotate the cam means to a low processing position to immerse the leads in the liquid flux, to rotate the cam means to high transport position to lift the leads from the liquid flux, to move and station said transport over said heated pot for a predetermined time to dry the flux coating on said leads, to rotate the cam means to a low processing position to immerse the leads in the hot molten solder for a predetermined time, to rotate the cam means to a high position to lift the tinned leads from the hot molten solder, and to move the transport to the station over the flux tank.

23. The apparatus according to claim 11 wherein the carrier comprises a quadrilateral frame supporting a metallic mesh screen adapted to receive the leads of electronic components, said metallic mesh screen constructed of a metal not weddable by solder.

24. The apparatus according to claim 11 wherein said electronic-component carrier comprises a quadrilateral frame adapted to be supported by and moved by said cam means, a plurality of electronic-component mounting means for supporting at least one electronic component in the right orientation for tinning of at least one of its leads, said electronic-component mounting means adapted to be removably attached to said carrier means.

25. The apparatus according to claim 24 wherein the electronic component mounting means comprises:
  (a) a rail means having at first and second ends an adaptor to receive and support a plurality of integrated circuits on their bases;
  (b) a hinge means attached at the first end of said rail means;
  (c) a bail means attached to the second end of said rail means; and
  (d) a channel member having a planar backbone, two sidewalls extending therefrom, and first and second opposing ends, said member having spaced apart from said rail means in a parallel relationship with said sidewalls extending towards said rail means to encircle the top portion of the integrated circuits, the first end of said channel member attached to said hinge means to permit said member to move in a hinge relationship with respect to said rail means, the second end of said member engaging bail means to limit the hinge movement of said member with respect to said rail means.

26. The apparatus according to claim 25 wherein the quadrilateral frame has two opposing endwalls connected by two parallel side frames connected at right angles to the endwalls, each endwall having a cam-receiving means adapted to be received by said cam means for supporting said carrier for movement, said endwalls having movable attachment means to hold said integrated circuit support fixture.

27. The apparatus according to claim 26 wherein said removable attachment means comprises a vertical plate having a plurality of apertures adapted to receive the second ends of the rail means, a channel member of said integrated circuit support fixture, and a plurality of flexible vertical finger members attached to the other said end, each finger member having an aperture adapted to receive the first end of said channel member, the aperture of each finger member being coaxial with one of the apertures of said vertical plate.

28. An electronic component tinning apparatus comprising the following elements:
   (a) a longitudinal base unit having two longitudinally extending sides connected to a first end and an opposing second end, a top portion connected to and bounded by said sides and ends with an open longitudinal central cavity, and two spaced-apart, parallel longitudinally extending rails mounted on the top portion on opposing sides of said central cavity;
   (b) a flux tank system comprising a flux tank mounted in said central cavity approximate said first end to hold a liquid flux for flux-coating electronic component leads, said tank having a large liquid flux reservoir for flux coating and an overflow reservoir connected to the large reservoir and separated therefrom by an overflow weir, a liquid flux storage tank in fluid communication with said overflow reservoir to receive liquid flux from said overflow reservoir, and a pump means in fluid communication with said storage tank and large reservoir to pump liquid flux from said storage tank to said large reservoir;
   (c) a heated pot mounted in said central cavity approximate said second end to hold a hot molten solder bath for tinning the electronic component leads;
   (d) a powered, wheeled electronic-component transport adapted to ride on said rails to carry electronic components from said first end across the flux tank to the second end over said heated pot and back again;
   (e) two powered cam means mounted to said transport, rotatable to a high transport position and a low tinning position, said cam means adapted to carry and vertically move an electronic-component carrier to the high transport position and to the low tinning position;
   (f) first sensing means to detect the position of said transport on said base unit;
   (g) second sensing means to detect the position of each of said cam means; and
   (h) control means connected to said first and second sensing means to receive signals therefrom and connected to said powered transport and said powered cam means to send control signals thereto, said control means comprising a programmable microprocessor chip programmed with a master resonance program adapted to receive a subsidiary overlay program to monitor and control the temperature of said heated pot and the operation of said flux tank system and user-definable process variables to move said transport at the commencement of operation from said first end to a position over said flux tank for a predetermined time to flux-coat the leads of electronic components, to rotate the cam means to the low tinning position to lower the leads into the liquid flux, to rotate the cam means to the high transport position to lift the leads from the liquid flux, to move the transport to a position over said heated pot to dry the flux coating on said leads, to rotate the cam means to a low tinning position to lower the leads into the hot molten solder for a predetermined time, to rotate the cam means to a high transport position to lift the tinned leads from the hot molten solder, and to move the transport back to said first end.

29. A powered, wheeled transport for carrying an electronic component for soldering on a soldering apparatus having fluxing, drying and soldering stations comprising:
   (a) a chassis supported by a plurality of rotatable wheels for movement back and forth along a horizontal track;
   (b) a means for powering at least one of said wheels to move said chassis back and forth along said track;
   (c) first and second parallel rotatable cam means rotatably supported by said chassis and adapted to support and move an electronic-component carrier to flux, dry and solder the electronic component leads at fluxing, drying and soldering stations; and
   (d) a means for rotating said first and second cam means to move the electronic-component carrier.

30. The transport according to claim 29 including a first sensing means to detect the position of said chassis on said track, a second sensing means to detect the rotating position of each of said first and second cam means, and a control means to control the means for powering at least one of said wheels and to control the means for rotating said first and second cam means.

31. The transport according to claim 30 wherein said control means includes a signal analyzer means which receives position signals from said first and second sensing means and a microprocessor means which receives information from said signal analyzer, said microprocessor means being programmed to control said control means in response to the information received from said signal analyzer.

32. The transport according to claim 30 wherein the first and second cam means are independently rotatable.

33. The transport according to claim 30 wherein each cam means comprises a rod rotatably supported at each of its ends by said chassis, at least two cylindrical cam means attached to said rod, said cam means being identically oriented and spaced apart on said rod, the cylindrical axis of said cam means having a common axis which is parallel to the longitudinal axis of said rod.

34. A powered, wheeled transport for carrying an electronic component for soldering on the soldering apparatus having fluxing, drying and soldering stations comprising:
   (a) a chassis supported by a plurality of rotatable wheels for movement back and forth along a horizontal track;
   (b) a means for powering at least one of said wheels to move said chassis back and forth along said track;
   (c) first and second parallel rotatable cam means rotatably supported by said chassis and adapted to support and move an electronic-component carrier to flux, dry and solder the electronic component leads at fluxing, drying and soldering stations;

(d) a means for rotating said first and second cam means to move said electronic-component carrier;
(e) first sensing means to detect the position of said chassis on said track;
(f) a second sensing means to detect the rotational position of each of said first and second cam means;
(g) a control means to control the means for powering at least one of said wheels and to control the means for rotating said first and second cam means, said control means including a signal analyzer means which receives position signals from said first and second sensing means and a microprocessor means which receives information from said signal analyzer, said microprocessor means being programmed to control said control means in response to the information received from said signal analyzer.

35. The transport according to claim 34 wherein each cam means comprises a rod rotatably supported at each of its ends by said chassis, at least two cylindrical cam means attached to said rod, said cam means being identically oriented and spaced apart on said rod, the cylindrical axis of said cam means having a common axis which is parallel to the longitudinal axis of said rod.

* * * * *